(12) United States Patent
Takizawa

(10) Patent No.: US 9,640,613 B2
(45) Date of Patent: May 2, 2017

(54) SEMICONDUCTOR DEVICE AND MANUFACTURING METHOD THEREOF

(71) Applicant: Renesas Electronics Corporation, Tokyo (JP)

(72) Inventor: Junichi Takizawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/218,004

(22) Filed: Jul. 23, 2016

(65) Prior Publication Data

US 2017/0062556 A1 Mar. 2, 2017

(30) Foreign Application Priority Data

Aug. 28, 2015 (JP) ................. 2015-168539

(51) Int. Cl.
| | |
|---|---|
| *H01L 29/04* | (2006.01) |
| *H01L 29/06* | (2006.01) |
| *H01L 29/78* | (2006.01) |
| *H01L 29/10* | (2006.01) |
| *H01L 29/66* | (2006.01) |
| *H01L 21/265* | (2006.01) |
| *H01L 21/266* | (2006.01) |

(52) U.S. Cl.
CPC ........ *H01L 29/0634* (2013.01); *H01L 21/266* (2013.01); *H01L 21/26586* (2013.01); *H01L 29/1095* (2013.01); *H01L 29/66734* (2013.01); *H01L 29/7813* (2013.01)

(58) Field of Classification Search
CPC ............ H01L 29/0634; H01L 29/7813; H01L 29/1095; H01L 29/66734; H01L 21/26586; H01L 21/266
See application file for complete search history.

(56) References Cited

U.S. PATENT DOCUMENTS 7,345,337 B2   3/2008   Miura

FOREIGN PATENT DOCUMENTS

JP   2005-191268 A   7/2005

*Primary Examiner* — Long Pham
(74) *Attorney, Agent, or Firm* — McGinn IP Law Group, PLLC

(57) ABSTRACT

Improvements are achieved in the performance and reliability of a semiconductor device. In a trench in an n-type semiconductor substrate, a gate electrode for a trench-gate field effect transistor is formed via a gate insulating film. A p-type semiconductor region for channel formation is formed so as to be adjacent to the trench. Over the p-type semiconductor region, a source $n^+$-type semiconductor region is formed so as to be adjacent to the trench. In the semiconductor substrate, a first p-type column is formed under the p-type semiconductor region. Under the first p-type column, a second p-type column is formed. The first p-type column is internally included in the second p-type column in plan view. The two-dimensional size of the second p-type column is larger than the two-dimensional size of the first p-type column.

9 Claims, 23 Drawing Sheets

SEMICONDUCTOR DEVICE AND MANUFACTURING METHOD THEREOF

CROSS-REFERENCE TO RELATED APPLICATIONS

The disclosure of Japanese Patent Application No. 2015-168539 filed on Aug. 28, 2015 including the specification, drawings and abstract is incorporated herein by reference in its entirety.

BACKGROUND

The present invention relates to a semiconductor device and a manufacturing method thereof, which can be used appropriately as, e.g., a semiconductor device including a trench-gate field effect transistor and a manufacturing method thereof.

A trench-gate field effect transistor has a structure in which, in a trench formed in a main surface of a semiconductor substrate, a gate electrode is embedded via a gate insulating film.

Japanese Unexamined Patent Publication No. 2005-191268 (Patent Document 1) describes a technique related to a trench-gate power MOSFET.

RELATED ART DOCUMENT

Patent Document

[Patent Document 1]
Japanese Unexamined Patent Publication No. 2005-191268

SUMMARY

Even in a semiconductor device including a trench-gate MISFET also, it is desired to maximize the reliability thereof or improve the performance thereof. Alternatively, it is desired to improve each of the reliability and performance of the semiconductor device.

Other problems and novel features of the present invention will become apparent from a statement in the present specification and the accompanying drawings.

According to an embodiment, a semiconductor device has a trench-gate field effect transistor. The semiconductor device includes: a semiconductor substrate having a first conductivity type; a gate electrode formed in a trench in a main surface of the semiconductor substrate via a gate insulating film; a first semiconductor region for forming a channel having a second conductivity type and formed in the semiconductor substrate so as to be adjacent to the trench; and a second semiconductor region for a source having the first conductivity type and formed over the first semiconductor region in the semiconductor substrate so as to be adjacent to the trench. The semiconductor device further includes: a third semiconductor region having the second conductivity type and formed under the first semiconductor region in the semiconductor substrate; a fourth semiconductor region having the second conductivity type and formed under the third semiconductor region; and a back-surface electrode for a drain formed over a back surface of the semiconductor substrate. The third semiconductor region is internally included in the fourth semiconductor region in plan view. A two-dimensional size of the fourth semiconductor region is larger than a two-dimensional size of the third semiconductor region.

Also, according to another embodiment, a semiconductor device has a trench-gate field effect transistor. The semiconductor device includes: a semiconductor substrate having a first conductivity type; a gate electrode formed in a trench in a main surface of the semiconductor substrate via a gate insulating film; a first semiconductor region for forming a channel having a second conductivity type and formed in the semiconductor substrate so as to be adjacent to the trench; and a second semiconductor region for a source having the first conductivity type and formed over the first semiconductor region in the semiconductor substrate so as to be adjacent to the trench. The semiconductor device further includes: a stacked structure formed under the first semiconductor region in the semiconductor substrate; and a back-surface electrode formed over a back surface of the semiconductor substrate. The stacked structure includes three or more vertically stacked third semiconductor regions each having the second conductivity type. Of the three or more third semiconductor regions included in the stacked structure, any two vertically adjacent to each other have a relationship therebetween such that the upper third semiconductor region is internally included in the lower third semiconductor region in plan view. Of the three or more third semiconductor regions included in the stacked structure, the third semiconductor region at a lowermost position has a two-dimensional size larger than a two-dimensional size of the third semiconductor region at an uppermost position.

Also, according to still another embodiment, a method of manufacturing a semiconductor device having a trench-gate field effect transistor includes the steps of: (a) providing a semiconductor substrate having a first conductivity type; (b) forming a trench in the semiconductor substrate; (c) forming, in the semiconductor substrate, third and fourth semiconductor regions each having a second conductivity type using an ion implantation method; and (d) forming a gate electrode in the trench via a gate insulating film. The method of manufacturing the semiconductor device further includes the steps of: (e) forming, in a region of the semiconductor substrate which is adjacent to the trench, a first semiconductor region for forming a channel having the second conductivity type using an ion implantation method; and (f) forming, in a region of the semiconductor substrate which is adjacent to the trench, a second semiconductor region for a source having the first conductivity type using an ion implantation method. At a stage where the steps (b) and (e) have been performed, the third semiconductor region is located under the first semiconductor region and the fourth semiconductor region is located under the third semiconductor region. The third semiconductor region is internally included in the fourth semiconductor region in plan view. A two-dimensional size of the fourth semiconductor region is larger than a two-dimensional size of the third semiconductor region.

According to each of the embodiments, it is possible to improve the reliability of the semiconductor device.

Otherwise, it is possible to improve the performance of the semiconductor device.

Alternatively, it is possible to improve the reliability and performance of the semiconductor device.

DETAILED DESCRIPTION

Figure 1:
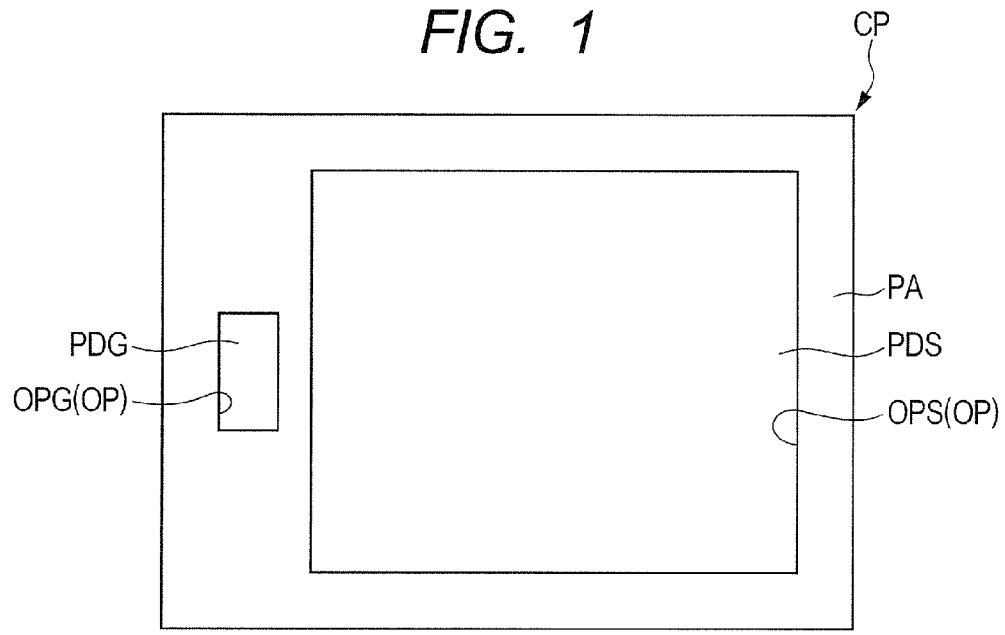
FIG. 1 is an overall plan view of a semiconductor device in an embodiment.

In the following embodiment, if necessary for the sake of convenience, the embodiment will be each described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others. Also, in the following embodiment, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers. Also, in the following embodiment, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiment, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe the embodiment in detail on the basis of the drawings. Note that, throughout all the drawings for illustrating the embodiment, members having the same functions are designated by the same reference numerals, and a repeated description thereof is omitted. In the following embodiment, a description of the same or like parts will not be repeated in principle unless particularly necessary.

In the drawings used in the embodiment, hatching may be omitted even in a cross section for improved clarity of illustration, while even a plan view may be hatched for improved clarity of illustration.

Embodiment

About Overall Structure of Semiconductor Device

A semiconductor device in the present embodiment will be described with reference to the drawings.

Figure 2:
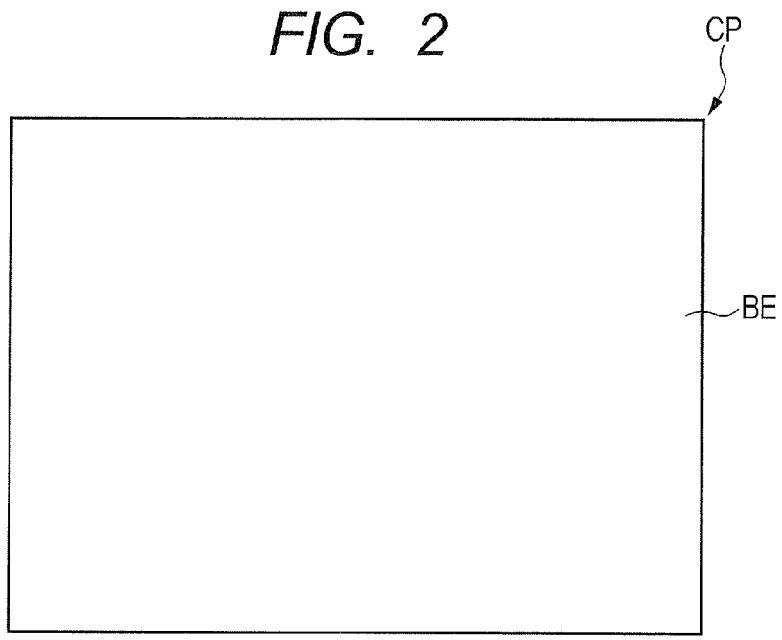
FIG. 2 is an overall plan view of the semiconductor device in the embodiment.

FIGS. 1 and 2 are overall plan views of a semiconductor device CP in the present embodiment, of which FIG. 1 shows the overall plan view of the upper surface side of the semiconductor device and FIG. 2 shows the overall plan view of the back surface side of the semiconductor device CP.

As shown in FIGS. 1 and 2, the semiconductor device (semiconductor chip) CP in the present embodiment has an upper surface as a main surface and a back surface (lower surface) as a main surface opposite to the upper surface. FIG. 1 shows the upper surface of the semiconductor device CP. FIG. 2 shows the back surface of the semiconductor device CP.

As shown in FIG. 1, the semiconductor device CP has, over the upper surface, a source bonding pad PDS as a first terminal and a gate bonding pad PDG as a control terminal. As shown in FIG. 2, the semiconductor device CP also has, over a back surface, a back-surface electrode BE as a second terminal. The source bonding pad PDS, the gate bonding pad PDG, and the back-surface electrode BE can function as the external coupling terminals of the semiconductor device CP.

Specifically, in the uppermost layer closer to the upper surface of the semiconductor device CP, an insulating film PA as a surface protective film is formed. From a source opening OPS provided in the insulating film PA, the source bonding pad PDS is exposed. From the gate opening OPG provided in the insulating film PA, the gate bonding pad PDG is exposed. On the other hand, the back-surface electrode BE is in the outermost layer closer to the back surface (lower surface) of the semiconductor device CP. The back-surface electrode BE is formed over the entire back surface of the semiconductor device CP.

Figure 3:
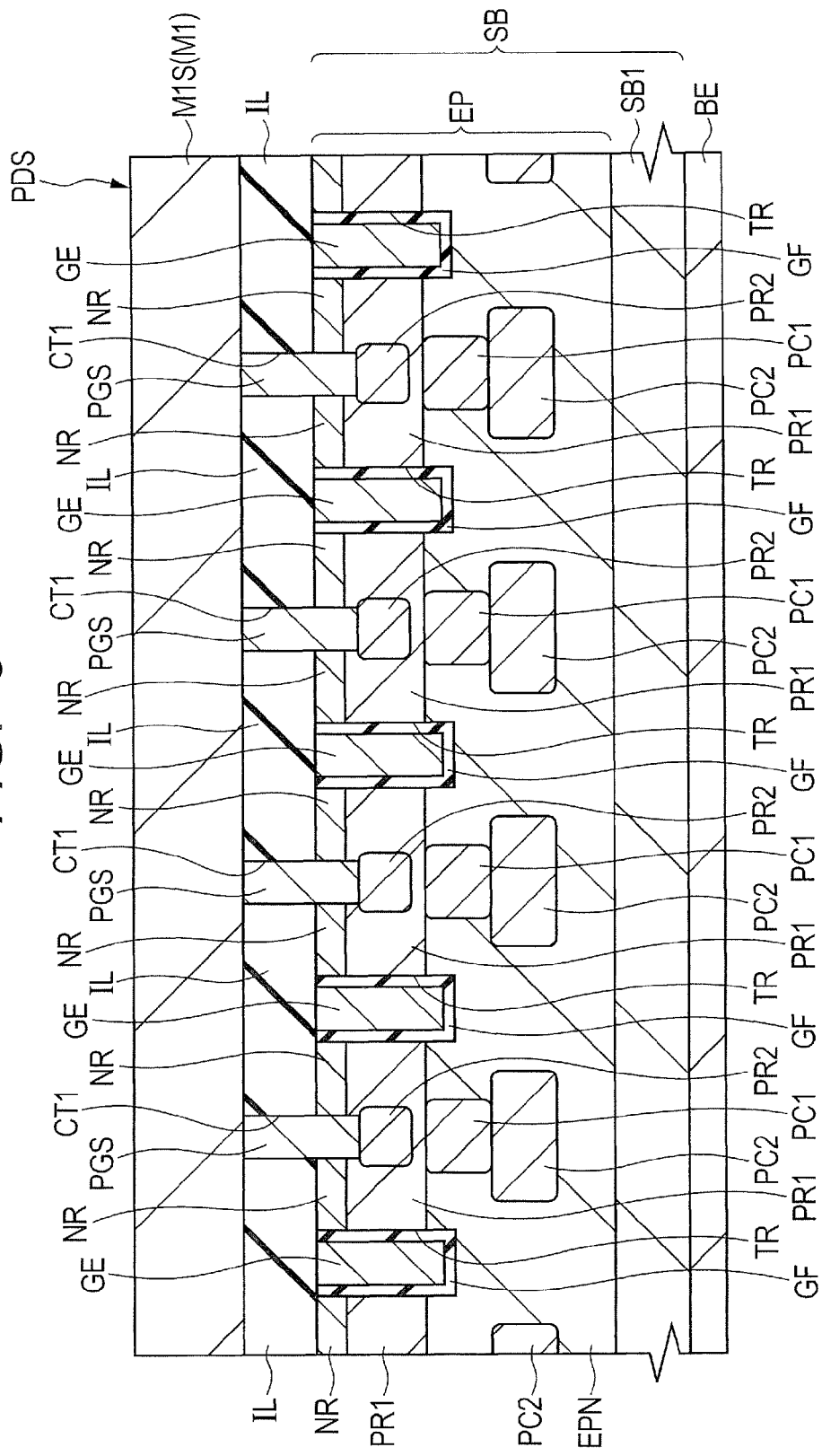
FIG. 3 is a main-portion cross-sectional view of the semiconductor device in the embodiment.
Figure 4:
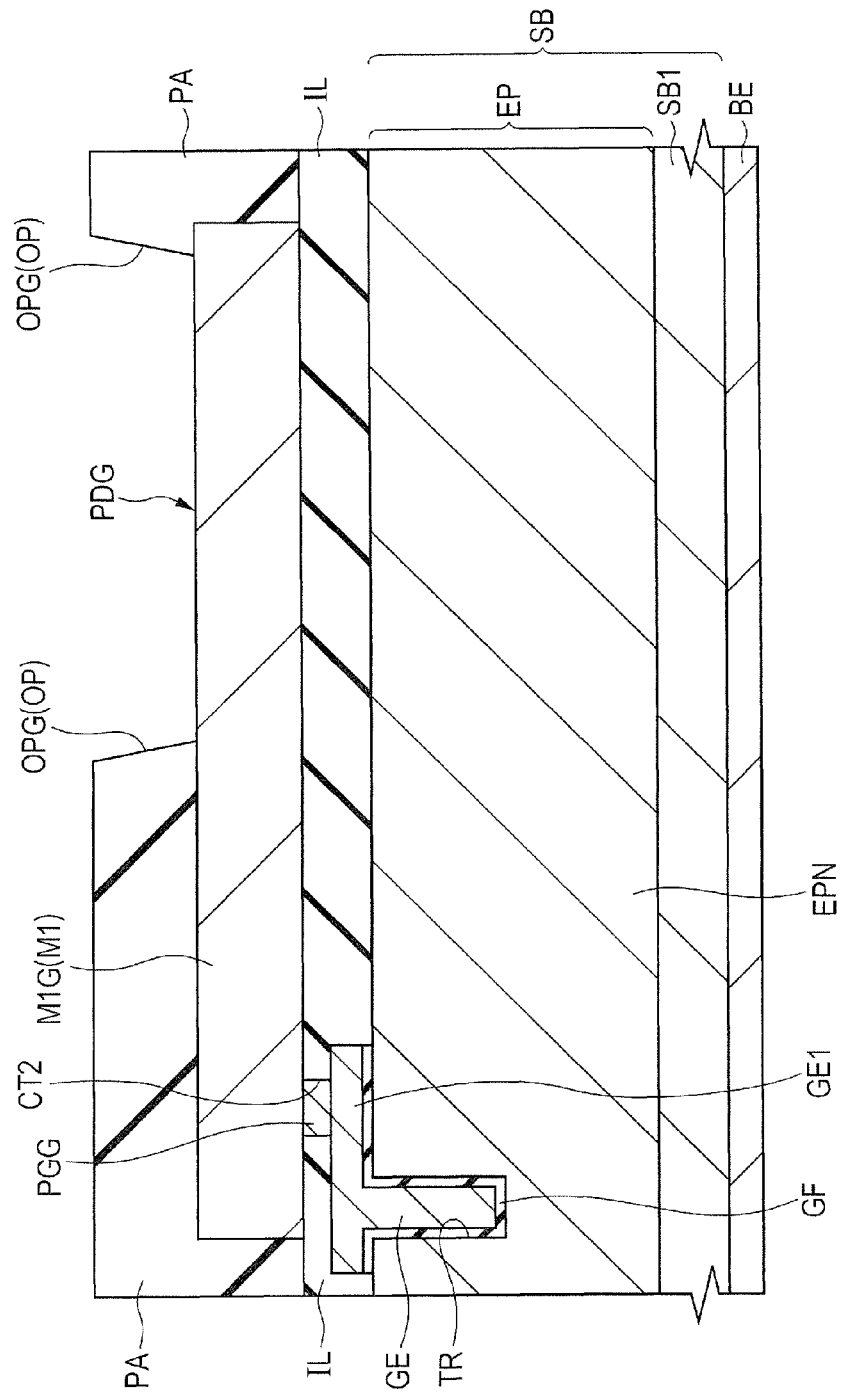
FIG. 4 is a main-portion cross-sectional view of the semiconductor device in the embodiment.

In a semiconductor substrate SB included in the semiconductor device CP, a semiconductor element which controls electrical conduction between a first terminal (which is the source bonding pad PDS herein) formed at the upper surface of the semiconductor device CP and a second terminal (which is the back-surface electrode BE herein) formed at the back surface of the semiconductor device CP is formed. As the semiconductor element, a trench-gate field effect transistor can appropriately be used. Note that the semiconductor substrate SB included in the semiconductor device CP is not shown in FIGS. 1 and 2, but is shown in FIGS. 3 and 4 described later.

Accordingly, the semiconductor device CP controls the semiconductor element formed in the semiconductor substrate SB to thus control the electrical conduction between the upper-surface first terminal and the back-surface second terminal and allow a current to flow between the upper-surface first terminal and the back-surface second terminal. Therefore, the semiconductor device CP can be used as a switching element in which a large current flows. The gate bonding pad PDG functions as a control terminal which controls the electrical conduction between the first and second terminals.

<About Internal Configuration of Semiconductor Device>

Next, a description will be given of an internal configuration of the foregoing semiconductor device CP with reference to the drawings.

Figure 5:
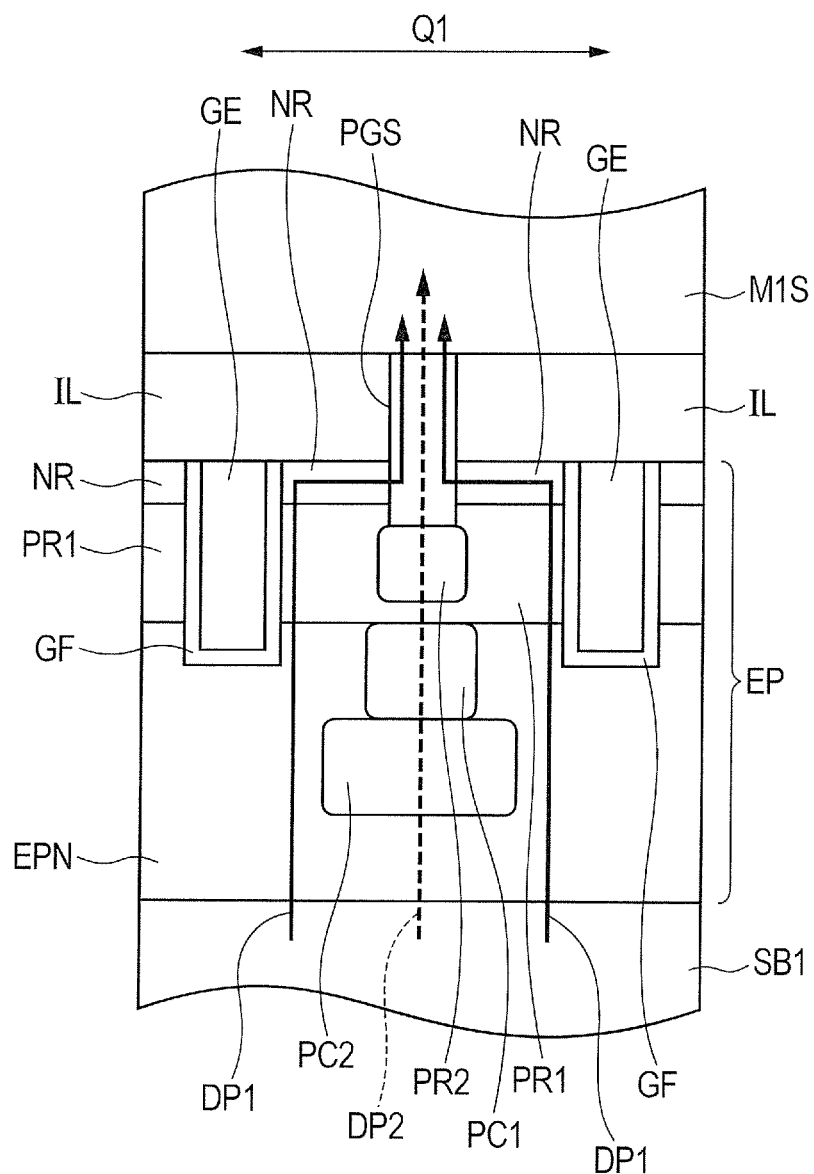
FIG. 5 is a partially enlarged cross-sectional view showing a part of FIG. 3 in enlarged relation.
Figure 6:
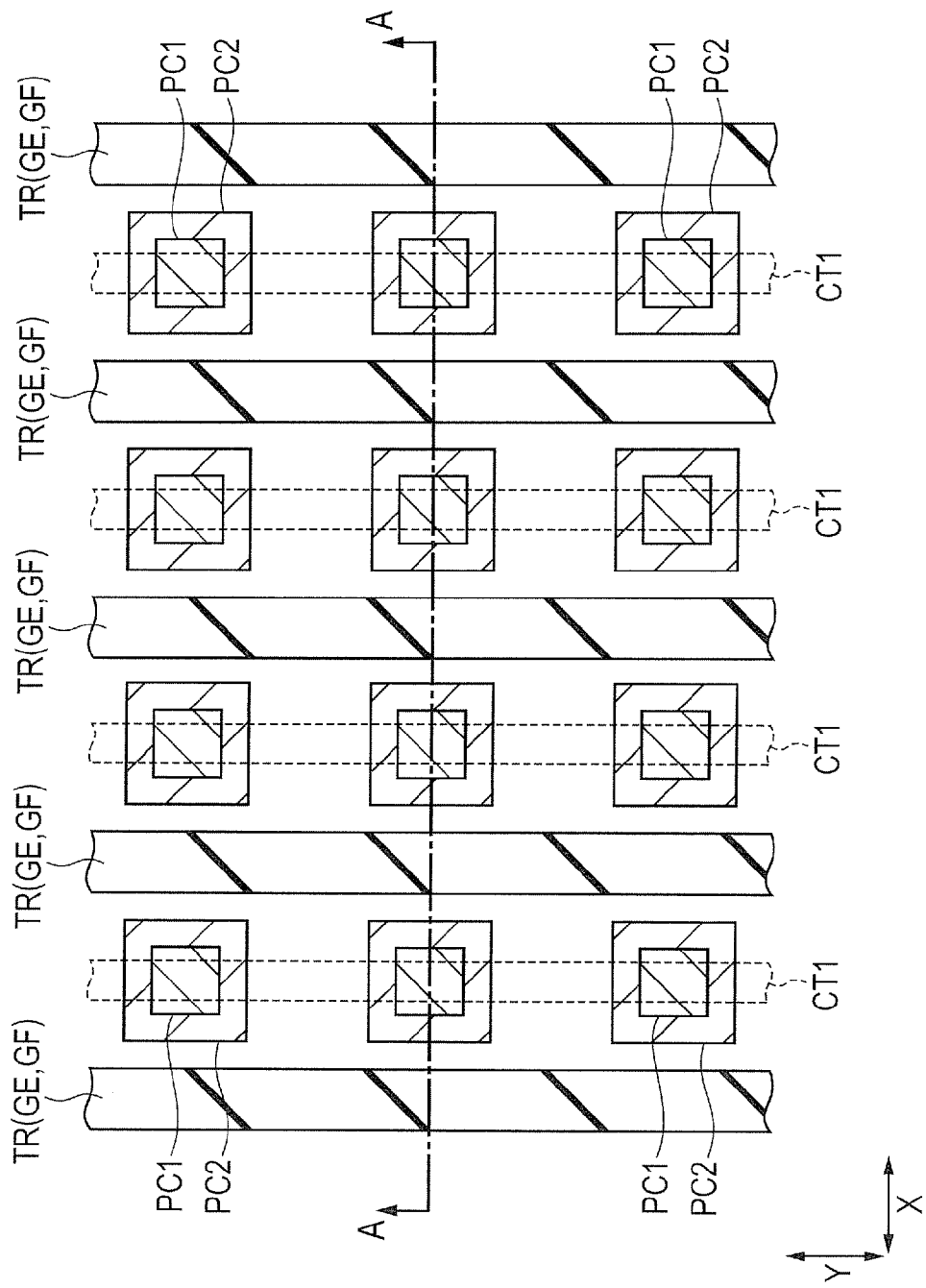
FIG. 6 is a main-portion plan view of the semiconductor device in the embodiment.
Figure 7:
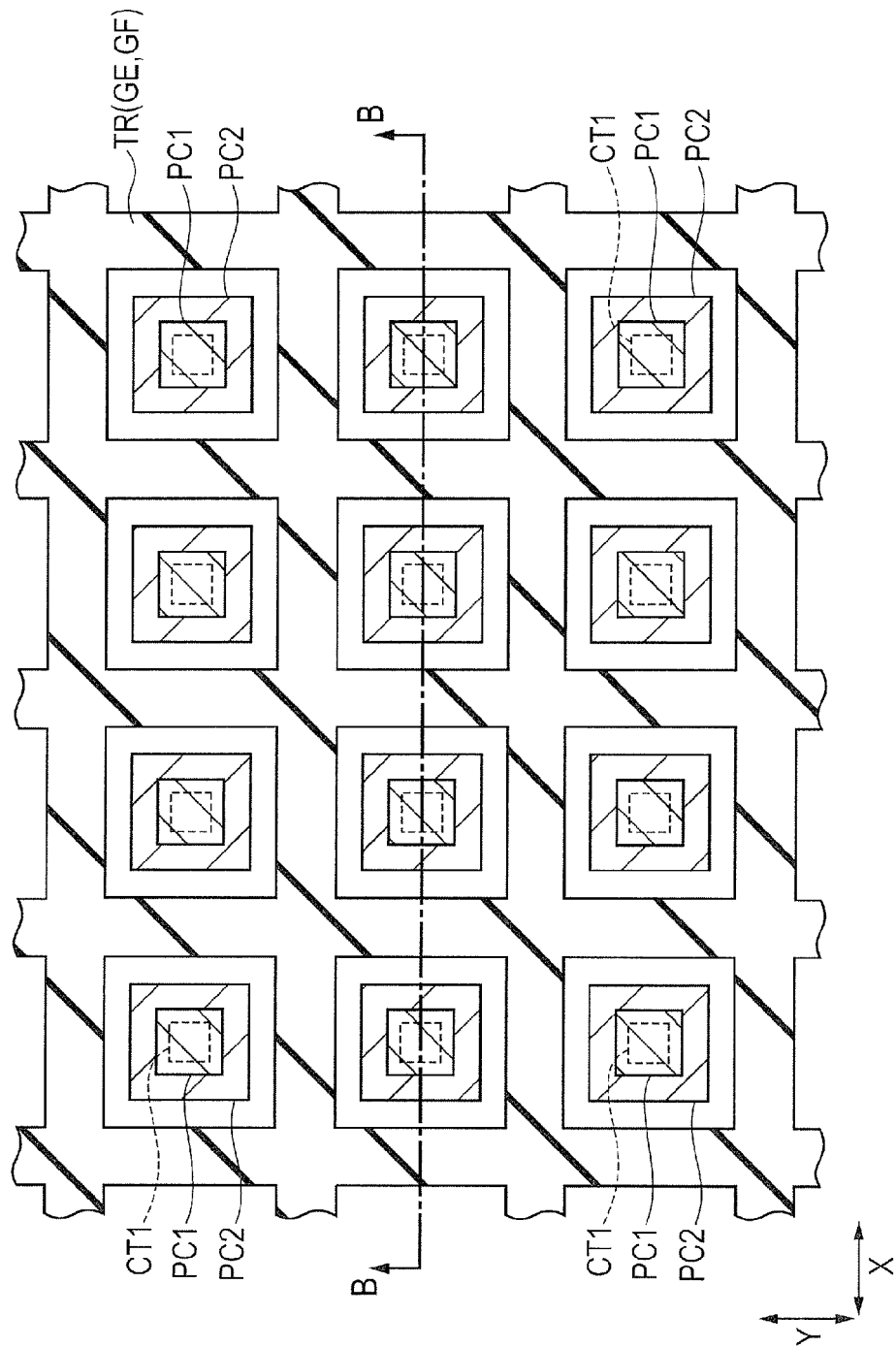
FIG. 7 is a main-portion plan view of the semiconductor device in the embodiment.
Figure 8:
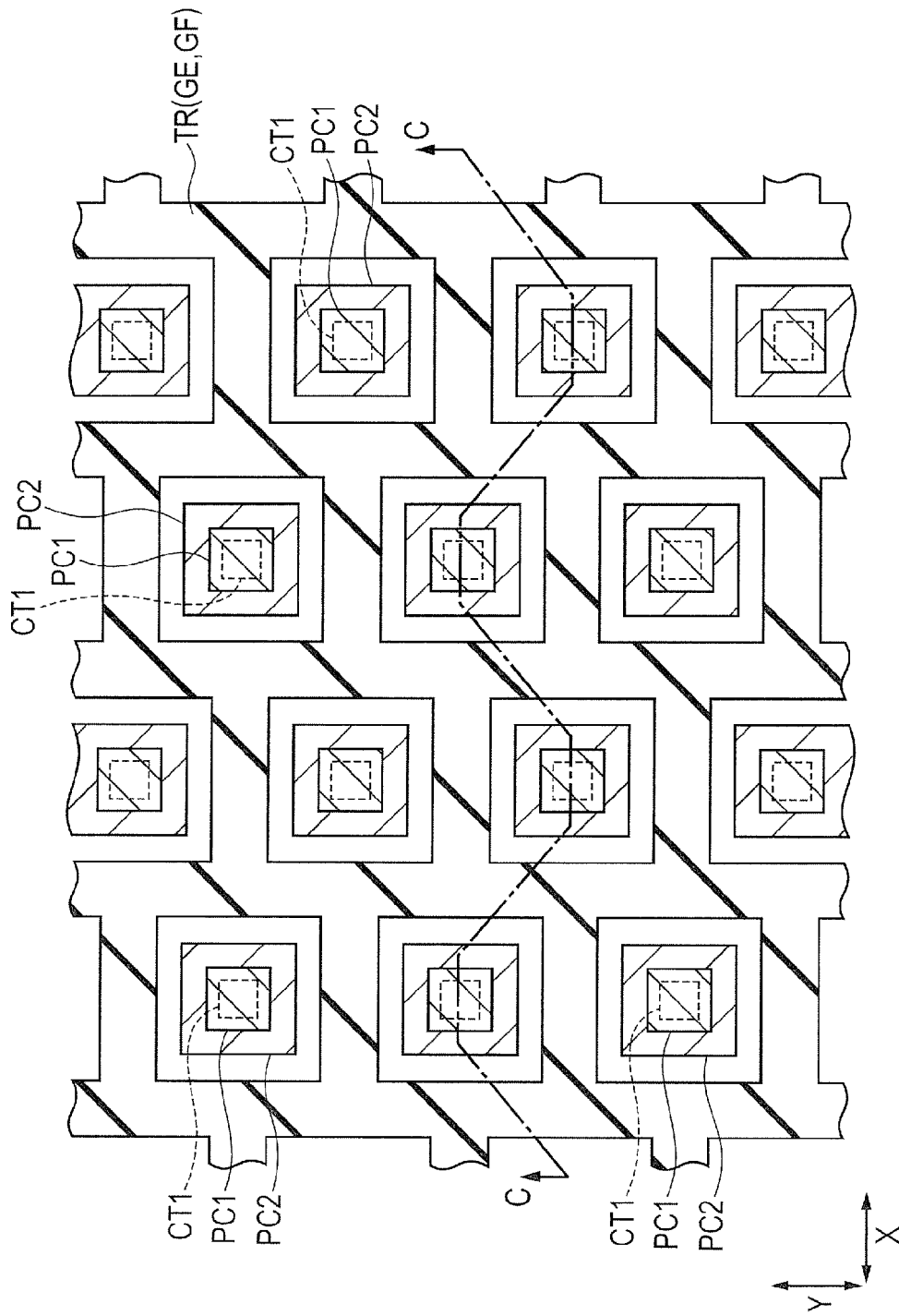
FIG. 8 is a main-portion plan view of the semiconductor device in the embodiment.

FIGS. 3 and 4 are main-portion cross-sectional views of the semiconductor device CP in the present embodiment. FIG. 3 corresponds to a cross-sectional view traversing a transistor cell formation region. FIG. 4 corresponds to a cross-sectional view traversing the gate bonding pad PDG. FIG. 5 is a partially enlarged cross-sectional view showing a part of FIG. 3 in enlarged relation in which, for improved clarity of illustration, hatching is omitted. In FIG. 5, current paths DP1 when a trench-gate MISFET is operated are shown by the solid-line arrows and a current path DP2 during an avalanche operation thereof is shown by the dotted-line arrow. FIGS. 6 to 8 are main-portion plan views of the semiconductor device CP in the present embodiment, which show an example of a two-dimensional layout of trenches TR, p-type columns PC1 and PC2, and contact holes CT1. Each of a cross-sectional view along the line A-A in FIG. 6, a cross-sectional view along the line B-B in FIG. 7, and a cross-sectional view along the line C-C in FIG. 8 has a cross-sectional structure in FIG. 3. FIGS. 6 to 8 are plan views but, for easier understanding, the p-type columns PC1 and PC2 are hatched with the thin lines, the regions where the trenches TR are formed are hatched with the thick lines, and the positions where the contact holes CT1 are formed are shown by the dotted lines.

The semiconductor device CP in the present embodiment includes trench-gate field effect transistors, e.g., trench-gate MISFETs (Metal Insulator Semiconductor Field Effect Transistors). Accordingly, in the semiconductor substrate SB included in the semiconductor device CP in the present embodiment, the trench-gate MISFETs are formed. The trench-gate MISFETs formed in the semiconductor substrate SB can also be regarded as a power transistor (power semiconductor element).

As shown in FIGS. 3 and 4, the semiconductor substrate SB included in the semiconductor device CP in the present embodiment has a substrate main body (semiconductor substrate or semiconductor wafer) SB1 made of, e.g., $n^+$-type monocrystalline silicon into which arsenic (As) has been introduced or the like and a semiconductor layer EP made of, e.g., $n^-$-type monocrystalline silicon and formed over the main surface of the substrate main body SB1. The semiconductor layer EP is an epitaxial layer and formed over the main surface of the substrate main body SB1 by epitaxial growth. Accordingly, the semiconductor substrate SB is a so-called epitaxial wafer. The substrate main body SB1 and the semiconductor layer EP have the same conductivity type (which is the n-type conductivity type herein), but the impurity concentration (n-type impurity concentration) of the substrate main body SB1 is higher than the impurity concentration (n-type impurity concentration) of the semiconductor layer EP. As a result, the resistivity of the substrate main body SB1 is lower than the resistivity of the semiconductor layer EP.

A description will be given below of a specific configuration of the trench-gate MISFETs formed in the semiconductor substrate SB.

In the main surface of the semiconductor substrate SB, the trench-gate MISFETs included in the power transistor are formed. Specifically, in the main surface of the semiconductor substrate SB, a plurality of unit transistor cells Q1 are formed. The plurality of unit transistor cells Q1 formed in the semiconductor substrate SB are coupled in parallel to each other to form one power transistor. FIG. 5 shows one of the unit transistor cells Q1 as a repetitive unit. The structure (unit transistor cell Q1) in FIG. 5 is repeated in a lateral direction in FIG. 3.

Each of the unit transistor cells Q1 is configured of the trench-gate MISFET. Note that the trench-gate MISFET has a trench-gate structure (gate electrode structure embedded in the trench provided in the substrate). Here, the two-dimensional region of the main surface of the semiconductor substrate SB where the plurality of unit transistor cells Q1 included in the power transistor are formed (arranged) is referred to as the transistor cell formation region.

The substrate main body SB1 and the semiconductor layer EP (p-type semiconductor region EPN) have the function of the drain region of each of the foregoing unit transistor cells Q1.

Over the entire back surface of the semiconductor substrate SB, the drain-electrode back-surface electrode (back-surface drain electrode or drain electrode) BE is formed.

Note that the main surface of the semiconductor substrate SB which is opposite to the main surface thereof in which the semiconductor layer EP is formed is referred to as the back surface of the semiconductor substrate SB. Also, the main surface of the substrate main body SB1 which is opposite to the main surface thereof in which the semiconductor layer EP is formed is referred to as the back surface of the substrate main body SB1. Accordingly, the back surface of the semiconductor substrate SB and the back surface of the substrate main body SB1 are identical. On the other hand, the main surface of the semiconductor substrate SB in which the trenches TR are formed is referred to as the upper surface of the semiconductor substrate SB. Also, the main surface of the semiconductor layer EP in which the trenches TR are formed is referred to as the upper surface of the semiconductor layer EP. Accordingly, the upper surface of the semiconductor substrate SB and the upper surface of the semiconductor layer EP are identical.

In the semiconductor layer EP in the transistor cell formation region, specifically in the upper-layer portion of the semiconductor layer EP, p-type semiconductor regions (p-type base region) PR1 are formed. Each of the p-type semiconductor regions PR1 has the function of the channel formation region of each of the foregoing unit transistor cells Q1.

In the semiconductor layer EP in the transistor cell formation region, $n^+$-type semiconductor regions ($n^+$-type source regions) NR are formed in the upper portions (upper-layer portions) of the p-type semiconductor regions PR1. Each of the $n^+$-type semiconductor regions NR has the function of the source region of each of the foregoing unit transistor cells Q1. Accordingly, each of the p-type semiconductor regions PR1 is a p-type semiconductor region for channel formation, while each of the $n^+$-type semiconductor regions NR is a source n-type semiconductor region. Under the $n^+$-type semiconductor regions NR, the p-type semiconductor regions PR1 are present. The impurity concentration (n-type impurity concentration) of each of the $n^+$-type semiconductor regions NR is higher than the impurity concentration (n-type impurity concentration) of an n-type semiconductor region EPN.

Of the semiconductor layer EP, the region which retains an n-type state when formed as an n-type epitaxial semiconductor layer is hereinafter referred to as the n-type semiconductor region (n-type semiconductor layer) EPN. In the semiconductor layer EP, the $n^+$-type semiconductor regions NR, the p-type semiconductor regions PR1, $p^+$-type semiconductor regions PR2, and the p-type columns (p type column regions) PC1 and PC2 are formed. The region of the semiconductor layer EP other than those regions into which no impurity has been implanted after the formation of the n-type semiconductor layer EP corresponds to the n-type semiconductor region EPN. The n-type semiconductor region EPN can function as the drain region of each of the foregoing unit transistor cells Q1. The n-type semiconductor region EPN has an impurity concentration lower than that of the n-type substrate main body SB1. The n-type semiconductor region EPN (n-type semiconductor layer EP) can also be regarded as a drift region (drift layer or field reducing layer).

Also, in the semiconductor substrate SB (specifically the semiconductor layer EP), the trenches TR are formed to extend from the main surface of the semiconductor substrate SB in the thickness direction thereof. In the trenches TR, gate electrodes (trench gate electrodes) GE are formed (embedded) via insulating films (gate insulating films) GF. Over the bottom and side surfaces of the trenches TR formed in the semiconductor substrate SB (semiconductor layer EP), insulating films GF each made of a silicon dioxide film or the like are formed. This provides a state where, between the gate electrodes GE embedded in the trenches TR and the semiconductor layer EP, the insulating films GF are interposed. That is, between the gate electrodes GE and the bottom and side surfaces of the trenches TR, the insulating films GF are interposed.

Note that the "bottom surface" is synonymous to a "lower surface". In the description of the present embodiment (including also modifications described later), the "bottom surface" can also be read as the "lower surface".

Each of the gate electrodes GE is made of a conductive film embedded in the trench TR in the semiconductor substrate SB. For example, the gate electrode GE is made of a polycrystalline silicon film (doped polysilicon film) into which an n-type impurity (e.g., phosphorus) has been introduced. Each of the gate electrodes GE has the function of the gate electrode of the foregoing unit transistor cell Q1. Each of the insulating films GF functions as the gate insulating film of the foregoing unit transistor cell Q1.

The trenches TR are formed so as to extend from the upper surface of the semiconductor substrate SB through the $n^+$-type semiconductor regions NR and the P-type semiconductor regions PR1 and terminate in the n-type semiconductor layer EP (i.e., in the n-type semiconductor region EPN). Accordingly, the bottom surfaces of the trenches TR are deeper than the bottom surfaces of the $n^+$-type semiconductor regions NR (i.e., the interfacial surfaces between the $n^+$-type semiconductor regions NR and the p-type semiconductor regions PR1) and deeper than the bottom surfaces of the p-type semiconductor regions PR1 (i.e., the interfacial surfaces between the p-type semiconductor regions PR1 and the n-type semiconductor region EPN). However, the bottom surfaces of the trenches TR have not reached the substrate main body SB1 and are located at middle points (middle points in the depth direction) in the n-type semiconductor layer EP (i.e., n-type semiconductor region EPN).

As a result, in the regions of the semiconductor substrate SB (semiconductor layer EP) which are adjacent to the trenches TR, i.e., in the regions of the semiconductor substrate SB (semiconductor layer EP) which are interposed between the trenches TR, the source $n^+$-type semiconductor regions NR, the p-type semiconductor regions PR1 each for channel formation located under the $n^+$-type semiconductor regions NR, and the drain n-type semiconductor region EPN located under the p-type semiconductor regions PR1 are present.

Note that, when a "depth" or "depth position" is mentioned in the present application, the "depth" or "depth position" is based on the upper surface of the semiconductor substrate SB and corresponds to a distance from the upper surface of the semiconductor substrate SB (depth in a direction perpendicular to the upper surface of the semiconductor substrate SB). The part of the semiconductor substrate SB which is distant from the upper surface of the semiconductor substrate SB (in other words, closer to the back surface of the semiconductor substrate SB) is assumed to be a deeper part, while the part of the semiconductor substrate SB which is closer to the upper surface of the semiconductor substrate SB is assumed to be a shallower part.

FIGS. 6 to 8 show an example of a two-dimensional layout of the trenches TR and the p-type columns PC1 and PC2. Note that the X-direction and the Y-direction are parallel with the main surface of the semiconductor substrate SB and intersect each other. Preferably, the X-direction and the Y-direction are orthogonal to each other. In FIGS. 6 to 8, the p-type columns PC2 are also present immediately under the p-type columns PC1 (regions overlapping the p-type columns PC1 in plan view).

In the case of FIG. 6, the trenches TR are formed in a fringe (stripe) pattern in plan view. That is, in the case of FIG. 6, the plurality of trenches TR are arranged at predetermined intervals in the X-direction to extend in the Y-direction in plan view. Since the gate electrodes GE are embedded in the trenches TR via the insulating films GF, the two-dimensional layout of the gate electrodes GE embedded in the trenches TR is basically the same as the two-dimensional layout of the trenches TR. Consequently, in the case of FIG. 6, a configuration is obtained in which the plurality of gate electrodes GE each extending in the Y-direction are arranged at the predetermined intervals in the X-direction in plan view. Note that the wording "in plan view" corresponds to the case where an object is viewed in a plane parallel with the main surface of the semiconductor substrate SB.

In the case of FIG. 6, in the two-dimensional region interposed between any two of the trenches TR each extending in the Y-direction and adjacent to each other in the X-direction, the $n^+$-type semiconductor region NR, the p-type semiconductor region PR1, the p-type column PC1, and the p-type column PC2 are provided successively in descending order. In the case of FIG. 6, the contact holes CT1 described later and source plugs PGS embedded in the contact holes CT1 are disposed between any two of the trenches TR each extending in the Y-direction and adjacent to each other in the X-direction.

In the case of FIG. 7, the trenches TR are formed in a grid pattern in plan view. That is, in the case of FIG. 7, a configuration is provided in which the plurality of trenches TR each extending in the Y-direction and arranged at predetermined intervals in the X-direction and the plurality of trenches TR each extending in the X-direction and arranged at predetermined intervals in the Y-direction intersect each other in plan view. In this case, the configuration is such that the plurality of gate electrodes GE each extending in the Y-direction and arranged at the predetermined intervals in the X-direction and the plurality of gate electrodes GE each extending in the X-direction and arranged at the predetermined intervals in the Y-direction intersect each other in plan view. This provides a state where, at the points of intersection, the gate electrodes GE each extending in the Y-direction and the gate electrodes GE each extending in the X-direction are integrally connected with each other.

In the case of FIG. 7, the semiconductor layer EP is partitioned into the rectangular two-dimensional regions (island portions or isle portions) surrounded by the trenches TR in plan view. The rectangular two-dimensional regions resulting from the partitioning are arranged in the X- and Y-directions as an array. In each of the rectangular two-dimensional regions defined (surrounded) by the trenches TR, the $n^+$-type semiconductor region NR, the p-type semiconductor region PR1, the p-type column PC1, and the p-type column PC2 are provided successively in descending order. Also, in the case of FIG. 7, the contact holes CT1 described later and the source plugs PGS embedded in the contact holes CT1 are disposed in the rectangular two-dimensional regions defined by the trenches TR in plan view and have rectangular two-dimensional shapes.

A two-dimensional layout in the case of FIG. 8 is similar to a two-dimensional layout in the case of FIG. 7, but is different therefrom in that the rectangular two-dimensional regions defined by the trenches TR are arranged in a zigzag pattern.

That is, in the case of FIG. 8, the plurality of trenches TR each extending in the Y-direction are arranged at predetermined intervals in the X-direction in plan view, while the trenches TR each extending in the Y-direction and adjacent to each other in the X-direction are connected using the plurality of trenches TR each extending in the X-direction and arranged at predetermined intervals in the Y-direction.

In the same manner as in the case of FIG. 7, in the case of FIG. 8 also, the semiconductor layer EP is partitioned into the rectangular two-dimensional regions (island portions or isle portions) surrounded by the trenches TR in plan view. In each of the rectangular two-dimensional regions defined (surrounded) by the trenches TR, the $n^+$-type semiconductor region NR, the p-type semiconductor region PR1, the p-type column PC1, and the p-type column PC2 are provided successively in descending order. Also, in the same manner as in the case of FIG. 7, in the case of FIG. 8 also, the contact holes CT1 described later and the source plugs PGS embedded in the contact holes CT1 are disposed in the rectangular two-dimensional regions defined by the trenches TR in plan view and have rectangular two-dimensional shapes.

However, in the case of FIG. 7, the plurality of trenches TR each linearly extending in the X-direction intersect the plurality of trenches TR each linearly extending in the Y-direction in plan view. As a result, in the case of FIG. 7, the rectangular two-dimensional regions defined by the trenches TR are arranged as an array in which the rectangular two-dimensional regions are linearly aligned in each of the X-direction and the Y-direction in plan view. On the other hand, in the case of FIG. 8, the plurality of trenches TR each linearly extending in the Y-direction are connected using the plurality of trenches TR each extending in the X-direction. However, any two adjacent pairs of the (four) trenches TR each linearly extending in the Y-direction and adjacent to each other in the X-direction are connected at positions shifted from each other in the Y-direction (shifted from each other by half a pitch). Accordingly, in the case of FIG. 8, the rectangular two-dimensional regions defined by the trenches TR are arranged as an array in a zigzag pattern.

As can also be seen from FIGS. 6 to 8, each of the trenches TR shown in FIGS. 3 and 5 and the gate electrode GE embedded therein extend in a direction perpendicular to the surfaces of the paper sheets with FIGS. 3 and 5. The gate electrodes GE are integrally connected in a region not shown in the cross-sectional views of FIGS. 3 and 5. Consequently, the gate electrodes GE of the plurality of unit transistors cells Q1 formed in the transistor cell formation region are electrically coupled to each other and also electrically coupled to a gate line M1G described later.

The upper surface of the gate electrode GE embedded in each of the trenches TR via the insulating film GF is at a position substantially the same as or slightly lower than that of the upper surface of the region of the semiconductor substrate SB which is adjacent to the trench TR (i.e., the upper surface of the $n^+$-type semiconductor region NR). Note that the upper surface of the gate electrode GE embedded in each of the trenches TR via the insulating film GF is at a position higher than that of the bottom surface of the $n^+$-type semiconductor region NR. On the other hand, the bottom surface of the gate electrode GE embedded in each of the trenches TR via the insulating film GF is at a position lower (deeper) than that of the bottom surface of the p-type semiconductor region PR1. Accordingly, when viewed in the thickness direction of the semiconductor substrate SB, the gate electrode GE formed in each of the trenches TR overlaps the source $n^+$-type semiconductor region NR, the p-type semiconductor region PR1 for channel formation, and the drain n-type semiconductor region EPN.

Thus, the semiconductor device CP in the present embodiment has the gate electrodes GE formed in the trenches TR via the insulating films GF, the source $n^+$-type semiconductor regions NR formed in the regions of the semiconductor substrate SB which are adjacent to the trenches TR, the p-type semiconductor regions PR1 for channel formation located under the $n^+$-type semiconductor regions NR, and the drain n-type semiconductor region EPN located under the p-type semiconductor regions PR1.

Note that, in the following description, "the region interposed between the trenches TR" can also be read as "the region surrounded by the trenches TR" or "the region circumferentially surrounded by the trenches TR". This is because, in the case of the layout in FIG. 6, "the region interposed between the trenches TR" corresponds to the region interposed between any two of the trenches TR each extending in the Y-direction and adjacent to each other in the X-direction but, in the case of the layout in FIG. 7 or 8, "the region interposed between the trenches TR" corresponds to "the region surrounded by any two of the trenches TR which extend in the X-direction and any two the trenches TR which extend in the Y-direction".

Since the bottom surfaces of the p-type semiconductor regions PR1 are shallower than the bottom surfaces of the trenches TR, the p-type semiconductor regions PR1 are formed in the regions of the semiconductor layer EP which are interposed between the trenches TR. Accordingly, under the trenches TR, the p-type semiconductor regions PR1 do not extend, but the n-type semiconductor region EPN extends.

In the semiconductor layer EP, the p-type columns (p-type semiconductor regions) PC1 are formed under the p-type semiconductor regions PR1 and, under the p-type columns PC1, the p-type columns (p-type semiconductor regions) PC2 are formed. That is, stacked structures in which the p-type columns PC1 and PC2 are vertically aligned are formed under the p-type semiconductor regions PR1. In each of the stacked structures, the p-type column PC1 is at a higher position and the p-type column PC2 is at a lower position. Each of the p-type columns PC1 is a p-type semiconductor region into which a p-type impurity has been introduced. Each of the p-type columns PC2 is also a p-type semiconductor region into which a p-type impurity has been introduced.

The p-type column PC2 is formed under the p-type column PC1. In plan view, the p-type column PC2 includes the p-type column PC1 and has a two-dimensional size (plane area) larger than the two-dimensional size (plane area) of the p-type column PC1. In other words, the p-type column PC1 is formed over the p-type column PC2, is included in the p-type column PC2 in plan view, and has the two-dimensional size (plane area) smaller than the two-dimensional size (plane area) of the p-type column PC2. Accordingly, in plan view, the p-type column PC1 does not protrude from the p-type column PC2. Note that the two-dimensional size of a given component corresponds to the size (more specifically, area) of the component in plan view.

The p-type column PC1 is formed under the p-type semiconductor region PR1. In plan view, the p-type column PC1 is included in the p-type semiconductor region PR1 and has a two-dimensional size (plane area) smaller than the two-dimensional size (plane area) of the p-type semiconductor region PR1. Accordingly, in each of the regions of the semiconductor layer EP which are interposed between the adjacent trenches TR, the p-type semiconductor region PR1 has a portion immediately under which the p-type column PC1 is formed and a portion immediately under which the p-type column PC1 is not formed.

The bottom surface of the portion of the p-type semiconductor region PR1 which does not overlap the p-type column PC1 in plan view, the side surfaces of the p-type column PC1, and the side surfaces of the p-type column PC2 are adjacent to (in contact with) the portion (i.e., the n-type semiconductor region EPN) of the semiconductor layer EP which retains the n-type conductivity type.

The side surfaces of the trenches TR are adjacent to the $n^+$-type semiconductor region NR, the p-type semiconductor region PR1, and the n-type semiconductor region EPN, but are not adjacent to the p-type columns P1 and PC2. On the other hand, the bottom surfaces of the trenches TR are adjacent to the n-type semiconductor region EPN, but are not adjacent to any of the $n^+$-type semiconductor region NR, the p-type semiconductor region PR1, and the p-type columns PC1 and PC2. Thus, the p-type columns PC1 and PC2 are apart from the trenches TR.

The channel regions (n-type inversion layers) of the trench-gate MISFETs are formed in the portions of the p-type semiconductor regions PR1 which face the gate electrodes GE via the insulating films GF by applying a gate voltage of not less than the threshold voltage to each of the gate electrodes GE. Since the p-type columns PC1 and PC2 are apart from the trenches TR (i.e., are not adjacent to the trenches TR), it is possible to ensure current paths when the trench-gate MISFETs are brought into an ON state and allow currents to flow between the source plugs PGS and the back-surface electrode BE via the $n^+$-type semiconductor regions NR (source region), the channel regions, the n-type semiconductor region EPN (drain region), and the substrate main body SB1.

The p-type columns P1 and the p-type columns PC2 located thereunder have respective predetermined thicknesses. However, the thickness of each of the p-type columns PC1 and the thickness of each of the p-type columns PC2 located thereunder may be equal to or different from each other. The bottom surface of each of the p-type columns PC2 is deeper than the bottom surface of each of the trenches TR, while the upper surface of the p-type column PC2 is deeper than the bottom surface of the trench TR. On the other hand, the bottom surface of each of the p-type columns PC1 is deeper than the bottom surface of each of the trenches TR, while the upper surface of the p-type column PC1 is shallower than the bottom surface of the trench TR.

The side surface (side-surface outer periphery) of each of the p-type columns PC1 is surrounded by the n-type semiconductor region EPN. Also, the side surface (side-surface outer periphery) of each of the p-type columns PC2 is surrounded by the n-type semiconductor region EPN. In the semiconductor layer EP immediately under the p-type semiconductor regions PR1 and immediately under the trenches TR, the region where the p-type columns PC1 and PC2 are not formed serves as the n-type semiconductor region EPN.

As shown in FIGS. 3 and 5, the vertically aligned p-type columns PC1 and PC2 are in contact with each other. The bottom surfaces of the p-type columns PC1 are in contact with the upper surfaces of the p-type columns PC2 located under the p-type columns PC1.

Preferably, the vertically aligned p-type columns PC1 and PC2 are in contact with each other, as shown in FIGS. 3 and 5. However, in another form, the vertically aligned p-type columns PC1 and PC2 may also be apart from each other. In that case, between the bottom surface of each of the p-type columns PC1 and the upper surface of the p-type column PC2 located under the p-type column PC1, a part of the n-type semiconductor region EPN is interposed.

Also, as shown in FIGS. 3 and 5, the p-type semiconductor regions PR1 and the p-type columns PC1 are in contact with each other and the bottom surfaces of the p-type semiconductor regions PR1 and the upper surfaces of the p-type columns PC1 are in contact with each other.

Preferably, the p-type semiconductor regions PR1 and the p-type columns PC1 are in contact with each other, as shown in FIGS. 3 and 5. However, in another form, the p-type semiconductor regions PR1 and the p-type columns PC1 may also be apart from each other. In that case, between the bottom surface of each of the p-type semiconductor regions PR1 and the upper surface of the p-type column PC1, a part of the n-type semiconductor region EPN is interposed.

The n-type semiconductor region EPN may also be regarded as a drift region. Accordingly, it can also be considered that, in the drift region, the stacked structures in which the p-type columns PC1 and PC2 are vertically aligned are formed under the p-type semiconductor regions PR1.

In the case of FIGS. 6 to 8, each of the p-type columns PC1 and the p-type columns PC2 located thereunder has a rectangular two-dimensional shape. The rectangle forming the two-dimensional shape of the p-type column PC1 is smaller than the rectangle forming the two-dimensional shape of the p-type column PC2 located thereunder and is included in the rectangle forming the two-dimensional shape of the p-type column PC2 located thereunder in plan view. Each of the p-type columns PC1 and PC2 has a bar shape (more specifically, a generally cuboid shape) and has the predetermined thickness. However, the thickness of each of the p-type columns PC1 and the thickness of each of the p-type columns PC2 may be equal to or different from each other.

In the case of FIG. 7 or 8, in plan view, the stacked structure in which the p-type columns PC1 and PPC2 are vertically aligned is provided in each of the rectangular two-dimensional regions defined by the trenches TR in one-to-one correspondence. Note that, in this case, each of the p-type semiconductor regions PR1 is formed in the entire rectangular two-dimensional region defined by the trenches TR in plan view and, under the p-type semiconductor region PR1, the stacked structure in which the p-type columns PC1 and PC2 are vertically aligned is provided.

On the other hand, in the case of FIG. 6, in each of the two-dimensional regions interposed between any two of the trenches TR (trenches TR each extending in the Y-direction) which are adjacent to each other in the X-direction in plan view, a plurality of the stacked structures in which the p-type columns PC1 and PC2 are vertically aligned are disposed to be arranged at predetermined intervals in the Y-direction. In this case, in plan view, each of the p-type semiconductor regions PR1 is formed in the entire two-dimensional region interposed between any two of the trenches TR (trenches each extending in the Y-direction) which are adjacent to each other in the X-direction and, under the p-type semiconductor region PR1, the plurality of stacked structures in which the p-type columns PC1 and PC2 are vertically aligned are disposed to be arranged at predetermined intervals in the Y-direction.

Next, a description will be given also of a structure in layers located over the semiconductor substrate SB.

Over the upper surface of the semiconductor substrate SB, an insulating film (interlayer insulating film) IL is formed so as to cover the gate electrodes GE. The insulating film IL is an interlayer insulating film and made of, e.g., a silicon dioxide film. The gate electrodes GE are covered with the insulating film IL.

In the insulating film IL, the contact holes (openings or through holes) CT1 and CT2 are formed. The contact holes CT1 are source contact holes and formed (disposed) between the trenches TR adjacent to each other in plan view in the transistor cell formation region. The contact holes CT1 extend through the insulating film IL to reach the semiconductor layer EP.

As shown in FIGS. 3 and 5, the contact holes CT1 extend through the insulating film IL1 to further dig into a part of the semiconductor substrate SB (semiconductor layer EP) and extend through the $n^+$-type semiconductor regions NR. The bottom surfaces of the contact holes CT1 are deeper than the bottom surfaces of the $n^+$-type semiconductor regions NR, but are at positions shallower than those of the bottom surfaces of the p-type semiconductor regions PR1. In the p-type semiconductor regions PR1, at positions adjacent to the bottom surfaces of the contact holes CT1, the $p^+$-type semiconductor regions PR2 having impurity concentrations higher than those of the p-type semiconductor regions PR1 are formed. As a result, from the contact holes CT1, the $n^+$-type semiconductor regions NR, the p-type semiconductor regions PR1, and the $p^+$-type semiconductor regions PR2 are exposed.

Each of the contact holes CT2 is a gate contact hole and shown in FIG. 4. In the case of FIG. 4, a gate lead-out wiring portion (gate lead-out portion) GE1 formed integrally with the gate electrode GE is extended over the semiconductor substrate SB outside the trench TR and, over the gate lead-out wiring portion GE1, the contact hole CT2 is formed. At the bottom surface of the contact hole CT2, a part of the gate lead-out wiring portion GE1 is exposed. In the case of FIG. 4, the gate lead-out wiring portion GE1 is formed over the semiconductor layer EP via an insulating film in the same layer as that of the insulating film GF. However, in another form, it is also possible to form (extend) the gate lead-out wiring portion GE1 over a field insulating film (not shown) formed over the semiconductor layer EP.

In the contact holes CT1 and CT2, conductive plugs (PGS and PGG) are embedded as conductor portions (coupling conductor portions). That is, in the contact holes CT1, the conductive plugs PGS are embedded and, in the contact holes CT2, the conductive plugs PGG are embedded. The plugs embedded in the source contact holes CT1 are hereinafter referred to as the source plugs PGS and the plugs embedded in the gate contact holes CT2 are hereinafter referred to as the gate plugs PGG.

Each of the gate plugs PGG embedded in the gate contact holes CT2 has the bottom surface in contact with the gate lead-out wiring portion GE1. Accordingly, the gate plug PGG is electrically coupled to the gate lead-out wiring portion GE1.

The source contact holes CT1 are formed over the semiconductor substrate SB located between the trenches TR in plan view in the transistor cell formation region. The source contact holes CT1 extend through the insulating film IL and the $n^+$-type semiconductor regions NR so that the bottom surfaces of the source contact holes CT1 are in contact with the p+-type semiconductor regions PR2. Consequently, the source plugs PGS embedded in the source contact holes CT1 extend through the insulating film IL and the n+-type semiconductor regions NR. The bottom surfaces of the source plugs PGS are in contact with the p+-type semiconductor regions PR2, while parts of the side surfaces (specifically, side surfaces in the vicinities of the bottom portions) of the source plugs PGS are in contact with the n+-type semiconductor regions NR. As a result, the source plugs PGS are electrically coupled to both of the n+-type semiconductor regions NR and the p+-type semiconductor regions PR2.

The source plugs PGS are electrically coupled to the source n+-type semiconductor regions NR and also electrically coupled to the p+-type semiconductor regions PR2 which are in contact with and electrically coupled to the p-type semiconductor regions PR1. It follows therefore that the source plugs PGS are electrically coupled to the p-type semiconductor regions PR1 for channel formation through the p+-type semiconductor regions PR2. The source plugs PGS are in contact with the n+-type semiconductor regions NR and the p+-type semiconductor regions PR2 and may also be in contact with the p-type semiconductor regions PR1.

The source plugs PGS are electrically coupled to a source line M1S described later. It follows therefore that the source line M1S is electrically coupled not only to the source n+-type semiconductor regions NR, but also to the p-type semiconductor regions PR1 serving as channels. This allows a base potential to be held constant.

Over the insulating film IL in which the plugs PGS and PGG are embedded, wiring M1 made of a conductive film (conductor) is formed. The wiring M1 includes the source line M1S and the gate line M1G. The source line M1S and the gate line M1G are formed in the same layer in the same process steps. The source line M1S and the gate line M1G are each made of the conductive film in the same layer, but are isolated from each other.

Of the wiring M1, the gate line M1G extends also over each of the gate plugs PGG and is in contact with the gate plug PGG (the upper surface thereof) to be electrically coupled to the gate plug PGG. Accordingly, the gate line M1G is electrically coupled to the gate lead-out wiring portion GE1 via the gate plug PGG. Consequently, the gate line M1G is electrically coupled to each of the gate electrodes GE in the transistor cell formation region via the gate plug PGG and the gate lead-out wiring portion GE1.

The source line M1S is formed over substantially the entire two-dimensional region (transistor cell formation region) where the plurality of unit transistor cells Q1 are formed. The upper surface of each of the source plugs PGS is in contact with the lower surface of the source line M1S. Consequently, each of the source plugs PGS is electrically coupled to the source line M1S. That is, the plurality of source plugs PGS formed in the transistor cell formation region are electrically coupled to the common source line M1S. In plan view, the gate line M1G is formed at a position not overlapping the source line M1S and formed, e.g., around the source line M1S in plan view.

The source contact holes CT1 are formed over the semiconductor substrate SB located between the trenches TR in plan view in the transistor cell formation region. Accordingly, the plurality of contact holes CT1 are formed in the transistor cell formation region and the source regions (n+-type semiconductor regions NR) of the plurality of unit transistor cells Q1 provided in the transistor cell formation region and the channel formation regions (p-type semiconductor regions PR1) thereof are electrically coupled to the common source line M1S via the source plugs PGS embedded in the plurality of contact holes CT1. Thus, the source line M1S is electrically coupled to the source regions (n+-type semiconductor regions NR) of the plurality of unit transistor cells Q1 provided in the transistor cell formation region and the channel formation regions (p-type semiconductor regions PR1) via the source plugs PGS.

In the case of FIGS. 3 and 5, the p+-type semiconductor regions PR2 having the impurity concentrations higher than those of the p-type semiconductor regions PR1 are provided at positions in contact with the bottom surfaces of the source plugs PGS and included in the p-type semiconductor region PR1 and the source plugs PGS are electrically coupled to the p-type semiconductor regions PR1 via the p+-type semiconductor regions PR2. In another form, it is also possible to electrically couple the source plugs PGS to the p-type semiconductor regions PR1 by omitting the formation of the p+-type semiconductor regions PR2 and bringing the source plugs PGS into direct contact with the p-type semiconductor regions PR1. However, as shown in FIGS. 3 and 5, it is more preferable to interpose the p+-type semiconductor regions PR2 between the source plugs PGS and the p-type semiconductor regions PR1. This can reduce the contact resistances of the source plugs PGS and thus allow the source plugs PGS and the p-type semiconductor regions PR1 to be coupled to each other with low resistances. This also leads to the unlikelihood of an NPN parasitic transistor to be turned ON during an avalanche operation described later, which is also advantageous in terms of improving avalanche resistance.

FIGS. 3 to 5 show the case where the plugs PGS and PGG and the wiring M1 are separately formed. In another form, it is also possible to integrally form the plugs PGS and PGG and the wiring M1. In that case, the gate plugs PGG and the gate line M1G are integrally formed, while the source plugs PGS and the source line MIS are integrally formed.

The wiring M1 (gate line M1G and source line MIS) is covered with the insulating film PA for surface protection. That is, over the insulating film IL, the insulating film PA is formed so as to cover the wiring M1 (gate line M1G and source line MIS). The insulating film PA is the uppermost-layer film (insulating film) of the semiconductor device CP. The insulating film PA can also be regarded as a passivation film. The insulating film PA is made of, e.g., a polyimide-based resin or the like.

In the insulating film PA, a plurality of openings OP are formed and, from each of the openings OP, a part of the wiring M1 is exposed. The wiring M1 exposed from the openings OP serves as bonding pads (pad electrodes).

That is, as shown in FIGS. 1 and 4, the gate line M1G exposed from the gate opening OPG formed in the insulating film PA forms the gate bonding pad PDG. Also, as shown in FIGS. 1 and 3 described above, the source line M1S exposed from the source opening OPS formed in the insulating film PA forms the source bonding pad PDS. Note that the gate opening OPG is the one of the openings OP which is for forming the gate bonding pad and the source opening OPS is the one of the openings OP for forming the source bonding pad.

In the semiconductor device CP thus configured, an operating current for each of the trench-gate MISFETs formed in the transistor cell formation region of the semiconductor substrate SB flows between the drain n-type semiconductor layer EP (n-type semiconductor region EPN) and the source n+-type semiconductor region NR along the side surfaces of each of the gate electrodes GE (i.e., the side surfaces of the each of trenches TR) in the thickness direction of the semiconductor substrate SB. That is, the channel is formed along the thickness direction of the semiconductor substrate SB. Of the p-type semiconductor region PR1, the region adjacent to each of the gate electrodes GE via the insulating film (gate insulating film) GF, i.e., the region extending along each of the trenches TR between the n$^+$-type semiconductor region NR and the n-type semiconductor layer EP (p-type semiconductor region EPN) serves as the channel formation region (channel layer).

Accordingly, each of the trench-gate MISFETs formed in the transistor cell formation region of the semiconductor substrate SB is also a vertical MISFET. The vertical MISFET corresponds to a MISFET in which a current between the source and the drain flows in the thickness direction (direction generally perpendicular to the main surface of the semiconductor substrate) of a semiconductor substrate (which is the semiconductor substrate SB herein).

To cause a current to flow in each of the trench-gate MISFETs, in a state where a potential higher than that at the source bonding pad PDS (source line MIS) is applied to the back-surface electrode BE, a gate voltage of not less than the threshold voltage is applied to each of the gate electrodes GE via the gate line M1G or the like. As a result, the trench-gate MISFET is turned ON to allow a current to flow between the source bonding pad PDS and the back-surface electrode BE via the source line MIS, the source plug PGS, the source region (n$^+$-type semiconductor region NR), the channel layer, the semiconductor layer EP (drain region), and the substrate main body SB1.

The description has been given heretofore of the case where the n-channel trench-gate MISFETs are formed. However, in another form, it is also possible to switch the n- and p-type conductivity types.

<About Manufacturing Process of Semiconductor Device>

Next, referring to FIGS. 9 to 24, a description will be given of a manufacturing process of the semiconductor device CP in the present embodiment. FIGS. 9 to 24 are main-portion cross-sectional views of the semiconductor device CP in the present embodiment during the manufacturing process thereof and show the cross sections of the region corresponding to FIG. 3 described above.

Figure 9:
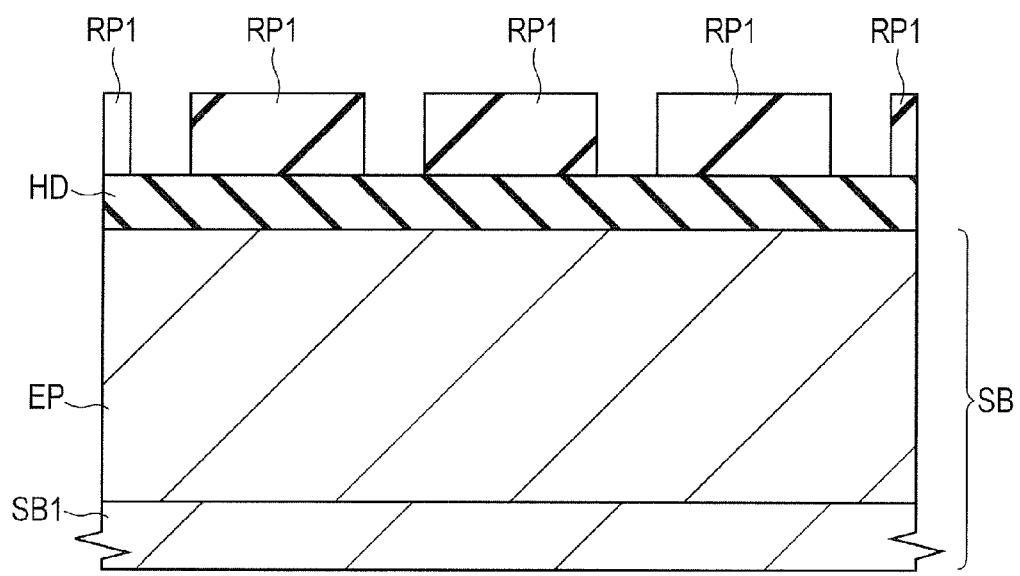
FIG. 9 is a main-portion cross-sectional view of the semiconductor device in the embodiment during a manufacturing process thereof.

To manufacture the semiconductor device in the present embodiment, first, as shown in FIG. 9, the semiconductor substrate (semiconductor wafer) SB is provided.

The semiconductor substrate SB can be formed by, e.g., epitaxially growing the semiconductor layer EP made of n$^-$-type monocrystalline silicon into which an n-type impurity such as, e.g., phosphorus (P) has been introduced over the main surface of the substrate main body SB1 as a semiconductor substrate (semiconductor wafer) made of n$^+$-type monocrystalline silicon into which an n-type impurity such as, e.g., arsenic (As) has been introduced or the like. The semiconductor substrate SB is a so-called epitaxial wafer. The impurity concentration (n-type impurity concentration) of the substrate main body SB1 is higher than the impurity concentration (n-type impurity concentration) of the semiconductor layer EP. The thickness of the semiconductor layer EP can be set to, e.g., about 2.5 µm to 10 µm. In another form, it is also possible to use, as the semiconductor substrate SB, a semiconductor substrate (semiconductor wafer) made of n-type monocrystalline silicon into which an n-type impurity has been introduced or the like.

Next, in the main surface of the semiconductor substrate SB (i.e., in the main surface of the semiconductor layer EP), the trenches TR are formed. The trenches TR can be formed using a photolithographic technique and an etching technique.

Specifically, by way of example, the trenches TR can be formed as follows.

Figure 10:
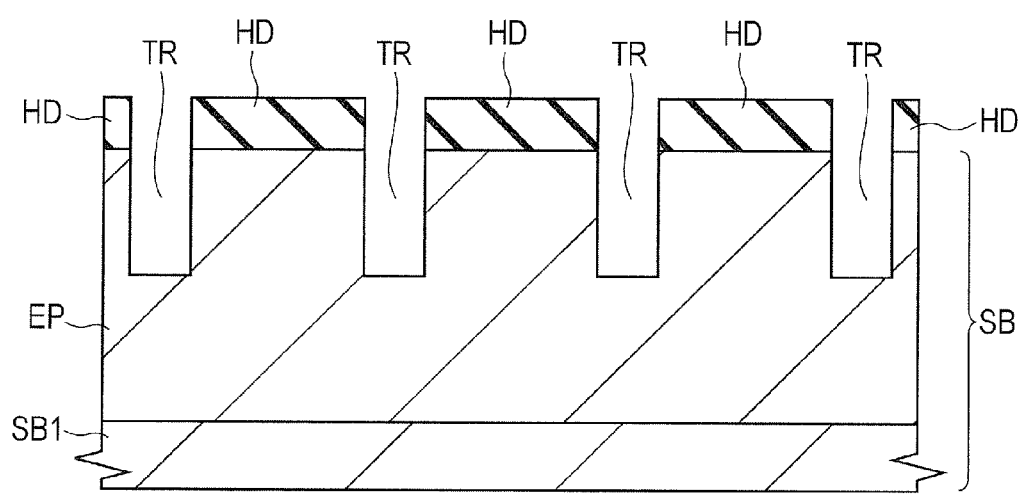
FIG. 10 is a main-portion cross-sectional view of the semiconductor device during the manufacturing process thereof, which is subsequent to FIG. 9.

First, as shown in FIG. 9, over the semiconductor substrate SB, an insulating film HD for a hard mask is formed. The insulating film HD is a single-layer insulating film or a stacked insulating film and is made of a stacked film including, e.g., a silicon dioxide film, a silicon nitride film stacked thereover, and a silicon dioxide film stacked thereover. At this stage, the insulating film HD is formed over the entire main surface (upper surface) of the semiconductor substrate SB. Then, over the insulating film HD, a photoresist pattern RP1 is formed using a photolithographic technique. The photoresist pattern RP1 has openings corresponding to the regions where the trenches TR are to be formed. Then, using the photoresist pattern RP1 as an etching mask, the insulating film HD is etched (dry-etched) to be selectively removed from the regions where the trenches TR are to be formed. Then, the photoresist pattern PR1 is removed. At this stage, a state has been achieved in which the insulating film HD has openings in the regions where the trenches TR are to be formed. Then, using the insulating film HD as an etching mask (hard mask), the semiconductor layer EP is etched (by, e.g., dry etching) to be formed with the trenches TR, as shown in FIG. 10. Then, the insulating film HD is removed by etching (by, e.g., wet etching) or the like. Thus, the trenches TR can be formed. In the case where the insulating film HD is formed of a stacked film including a silicon dioxide film, a silicon nitride film stacked thereover, and a silicon dioxide film stacked thereover, it is also possible to remove the upper two layers of the stacked film and form an insulating film ZM described later in a state where the lowermost silicon dioxide film is not removed but is left.

In another form, it is also possible to dry-etch the semiconductor layer EP using, as an etching mask, a photoresist pattern formed over the semiconductor substrate SB using a photolithographic technique and thus form the trenches TR.

Figure 11:
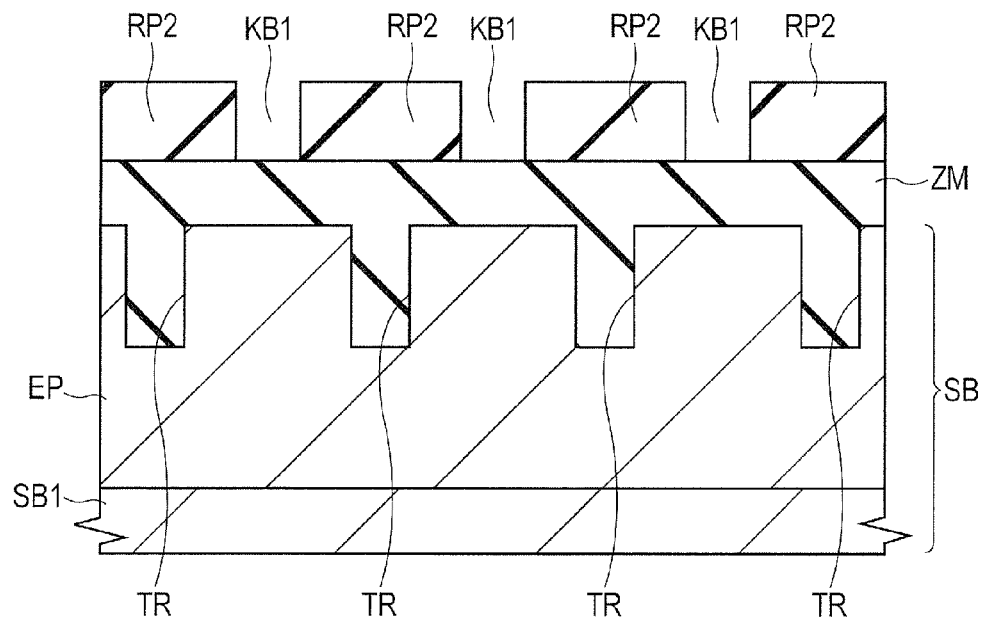
FIG. 11 is a main-portion cross-sectional view of the semiconductor device during the manufacturing process thereof, which is subsequent to FIG. 10.

Next, as shown in FIG. 11, over the main surface of the semiconductor substrate SB, the insulating film ZM is formed so as to be embedded in the trenches TR. The insulating film ZM is made of a silicon dioxide film or the like and can be formed using a CVD (Chemical Vapor Deposition) method or the like.

Next, over the insulating film ZM, using a photolithographic technique, a photoresist pattern (mask layer) RP2 is formed. The photoresist pattern RP2 has openings KB1 over the regions where the p-type columns PC1 are to be formed.

Figure 12:
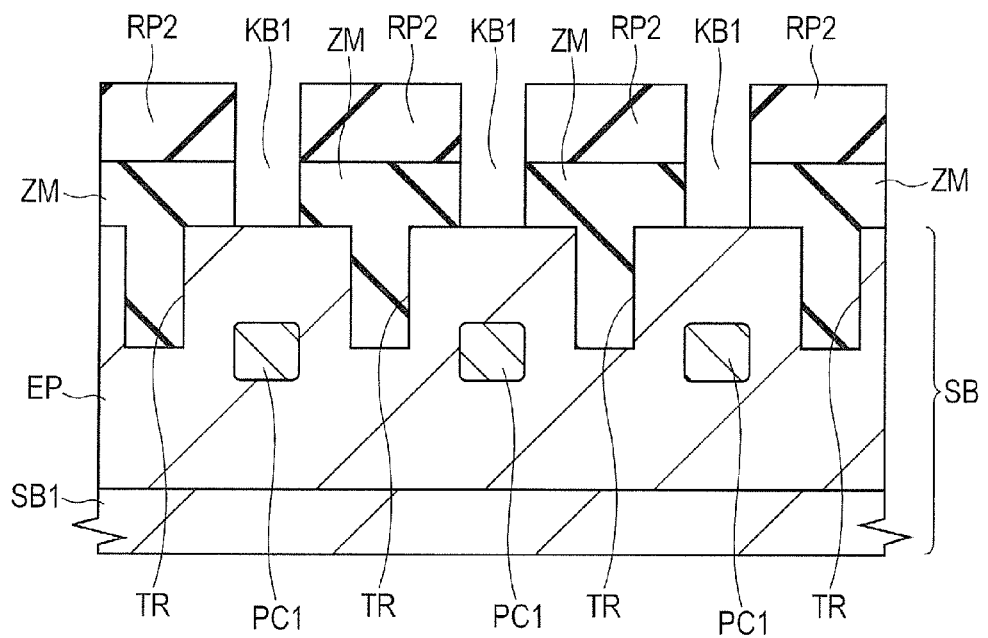
FIG. 12 is a main-portion cross-sectional view of the semiconductor device during the manufacturing process thereof, which is subsequent to FIG. 11.

Next, as shown in FIG. 12, using the photoresist pattern RP2 as an etching mask, the insulating film ZM is etched (by, e.g., dry etching) to be selectively removed from over the regions where the p-type columns PC1 are to be formed. This selectively removes the portions of the insulating film ZM which are exposed from the openings KB1 of the photoresist pattern RP2 and provides a state where the openings KB1 are formed continuously in the photoresist pattern RP2 and the insulating film ZM.

Next, as shown in FIG. 12, using the photoresist pattern RP2 and the insulating film ZM as a mask layer (ion implantation stopping mask), a p-type impurity (e.g., boron (B)) is ion-implanted into the semiconductor layer EP to form the p-type columns PC1. By adjusting an implantation energy during the ion implantation, each of the p-type columns CP1 is formed at a predetermined distance from the main surface of the semiconductor substrate SB (i.e., the main surface of the semiconductor layer EP).

Figure 13:
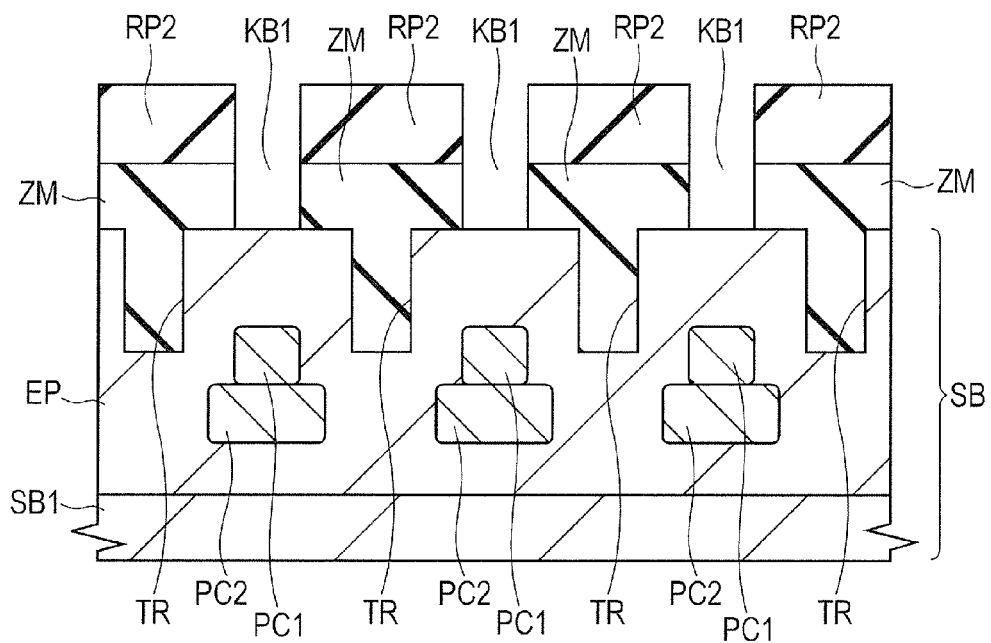
FIG. 13 is a main-portion cross-sectional view of the semiconductor device during the manufacturing process thereof, which is subsequent to FIG. 12.

Next, as shown in FIG. 13, using the photoresist pattern RP2 and the insulating film ZM as a mask layer (ion implantation stopping mask), a p-type impurity (e.g., boron (B)) is ion-implanted into the semiconductor layer EP to form the p-type columns PC2. By adjusting an implantation energy during the ion implantation, each of the p-type columns PC2 is formed at a predetermined distance from the main surface of the semiconductor substrate SB (i.e., the main surface of the semiconductor layer EP).

The implantation energy in the ion implantation for forming the p-type columns PC2 is higher than the implantation energy in the ion implantation for forming the p-type columns PC1. Accordingly, an implantation depth in the ion implantation for forming the p-type columns PC2 is deeper than an implantation depth in the ion implantation for forming the p-type columns PC1. As a result, the p-type columns PC2 are formed at positions deeper than those of the p-type columns PC1 and accordingly under the p-type columns PC1.

In the present embodiment, as the ion implantation for forming the p-type columns CP1, perpendicular ion implantation is performed and, as the ion implantation for forming the p-type columns PC2, oblique ion implantation is performed. That is, in the ion implantation for forming the p-type columns PC1, the angle of ion implantation is set such that the impurity ions enter the main surface of the semiconductor substrate SB generally perpendicularly thereto. On the other hand, in the ion implantation for forming the p-type columns PC2, the angle of ion implantation is set such that the impurity ions enter the main surface of the semiconductor substrate SB not generally perpendicularly thereto, but in an oblique direction.

Note that the "perpendicular ion implantation" indicates ion implantation in which the direction of ion implantation is a direction generally perpendicular to the main surface of the semiconductor substrate SB (i.e., a direction normal to the main surface of the semiconductor substrate SB). In vertical ion implantation, the impurity ions enter the main surface of the semiconductor substrate SB generally perpendicularly thereto. On the other hand, the "oblique ion implantation" indicates ion implantation in which the direction of ion implantation is a direction inclined from a direction normal to the main surface of the semiconductor substrate SB. In the oblique ion implantation, the impurity ions enter the main surface of the semiconductor substrate SB at an entry angle in an oblique direction which is not generally perpendicular to the main surface of the semiconductor substrate SB. The direction of ion implantation corresponds to the direction in which the impurity ions enter (ion beam enters) the main surface of the semiconductor substrate SB in the ion implantation.

As the ion implantation for forming the p-type columns PC1, the perpendicular ion implantation is used. Consequently, the two-dimensional regions of the semiconductor layer EP into which the impurity has been implanted substantially correspond to the openings KB1 in plan view. On the other hand, as the ion implantation for forming the p-type columns PC2, the oblique ion implantation is used. Consequently, the two-dimensional regions of the semiconductor layer EP into which the impurity has been introduced include the openings KB1 in plan view and are larger than the openings KB1. Accordingly, in plan view, the p-type columns PC2 include the p-type columns PC1 and the two-dimensional sizes of the p-type columns PC2 are larger than the two-dimensional sizes of the p-type columns PC1.

Figure 14:
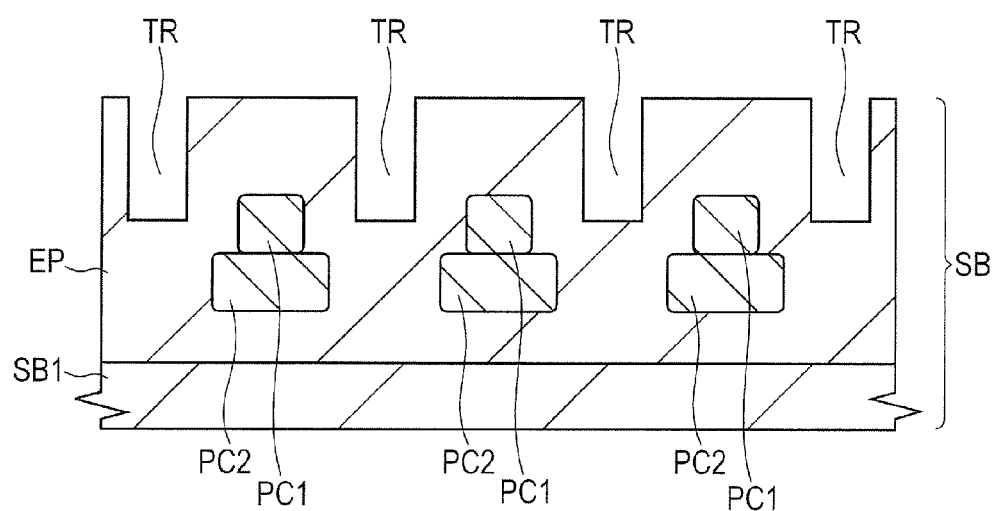
FIG. 14 is a main-portion cross-sectional view of the semiconductor device during the manufacturing process thereof, which is subsequent to FIG. 13.

Then, as shown in FIG. 14, the photoresist pattern RP2 and the insulating film ZM are successively removed.

Note that the description has been given heretofore of the case where the p-type columns PC1 are formed first by the ion implantation and then the p-type columns PC2 are formed by the ion implantation. However, in another form, it is also possible to reverse the order in which the p-type columns PC1 and PC2 are formed and form the p-type columns PC2 by ion implantation first and then form the p-type columns PC1 by ion implantation.

The description has also been given herein of the case where the insulating film ZM and the photoresist pattern RP2 are used as a mask layer for ion implantation. However, in another form, it is also possible to omit the formation of the insulating film ZM and form the p-type columns PC1 and PC2 using the photoresist pattern RP2 as a mask layer for ion implantation.

The description has also been given herein of the case where the perpendicular ion implantation is used appropriately as the ion implantation for forming the p-type columns PC1 and the oblique ion implantation is used appropriately as the ion implantation for forming the p-type columns PC2.

In another form, it is also possible to appropriately use the oblique ion implantation as each of the ion implantation for forming the p-type columns PC1 and the ion implantation for forming the p-type columns PC2. In that case, it is necessary to set an inclination angle for the ion implantation for forming the p-type columns PC2 larger than an inclination angle for the ion implantation for forming the p-type columns PC1. By thus setting the inclination angles, the p-type columns PC2 internally include the p-type columns PC1 and the two-dimensional sizes of the p-type columns PC2 are larger than the two-dimensional sizes of the p-type columns PC1.

Note that the inclination angle for ion implantation corresponds to the inclination angle of the direction of ion implantation relative to a direction normal to the main surface of the semiconductor substrate SB. That is, in ion implantation, the angle formed between the direction of ion implantation (entry direction of the impurity ions or ion beam) and the direction normal to the main surface of the semiconductor substrate SB (the angle at which the direction of ion implantation intersects the direction normal to the main surface of the semiconductor substrate SB) is the inclination angle of ion implantation. The inclination angle of ion implantation is referred to also as a tilt angle.

A description will be given herein of another method of forming the p-type columns PC1 and PC2 with reference to FIGS. 15 to 17.

Figure 15:
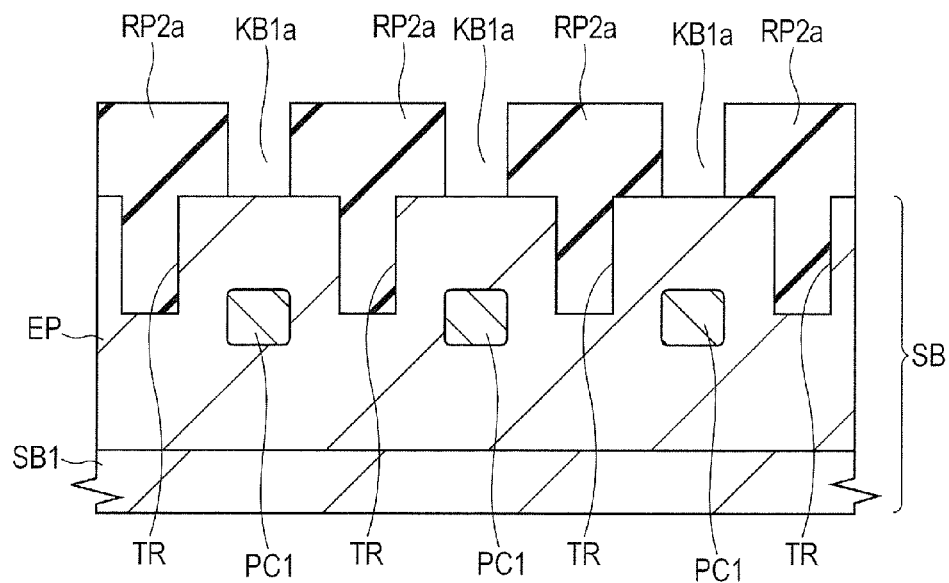
FIG. 15 is a main-portion cross-sectional view of the semiconductor device during the manufacturing process thereof, which is subsequent to FIG. 10.

After the foregoing step of forming the trenches TR and the foregoing step of removing the insulating film ZM are performed, as shown in FIG. 15, a photoresist pattern (mask layer) RP2a for forming the p-type columns PC1 is formed over the main surface of the semiconductor substrate SB using a photolithographic technique. The photoresist pattern RP2a has openings KB1a over the regions where the p-type columns PC1 are to be formed in plan view. The photoresist pattern RP2a may, but need not necessarily be, embedded in the trenches TR.

Next, using the photoresist pattern RP2a as a mask layer (ion implantation stopping mask), a p-type impurity (e.g., boron (B)) is ion-implanted into the semiconductor layer EP to form the p-type columns PC1. By adjusting an implantation energy during the ion implantation, each of the p-type columns PC1 is formed at a predetermined distance from the main surface of the semiconductor substrate SB (i.e., the main surface of the semiconductor layer EP). As the ion implantation performed at this time, perpendicular ion implantation can be used.

Figure 16:
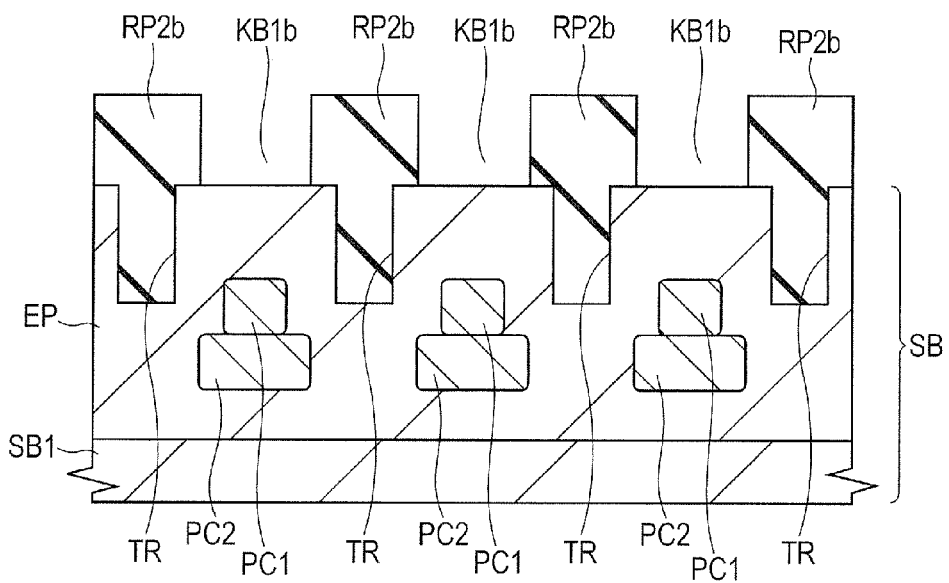
FIG. 16 is a main-portion cross-sectional view of the semiconductor device during the manufacturing process thereof, which is subsequent to FIG. 15.
Figure 17:
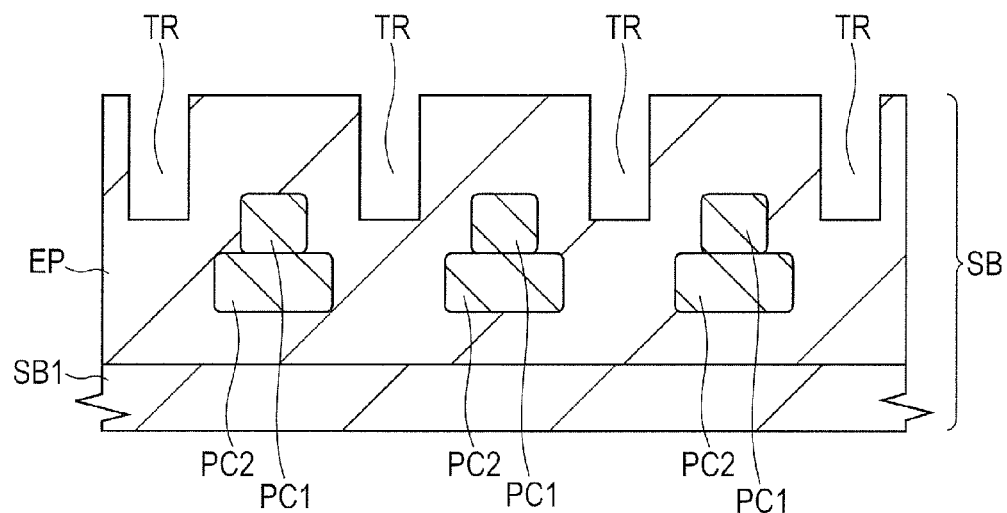
FIG. 17 is a main-portion cross-sectional view of the semiconductor device during the manufacturing process thereof, which is subsequent to FIG. 16.

Next, the photoresist pattern RP2a is removed and then, as shown in FIG. 16, a photoresist pattern (mask layer) RP2b for forming the p-type columns PC2 is formed over the main surface of the semiconductor substrate SB using a photolithographic technique. The photoresist pattern RP2b has openings KB1b over the regions where the p-type columns PC2 are to be formed in plan view. In plan view, the openings KB1b of the photoresist pattern RP2b internally include the openings KB1a of the photoresist pattern RP2a and the two-dimensional sizes of the openings KB1b are larger than the two-dimensional sizes of the openings KB1a. The photoresist pattern RP2b may, but need not necessarily be, embedded in the trenches TR.

Next, using the photoresist pattern RP2b as a mask layer (ion implantation stopping mask), a p-type impurity (e.g., boron (B)) is ion-implanted into the semiconductor layer EP to form the p-type columns PC2. By adjusting an implantation energy during the ion implantation, each of the p-type columns PC2 is formed at a predetermined distance from the main surface of the semiconductor substrate SB (i.e., the main surface of the semiconductor layer EP). As the ion implantation performed at this time, perpendicular ion implantation can be used. Then, as shown in FIG. 17, the photoresist pattern RP2b is removed.

An implantation energy in the ion implantation for forming the p-type columns PC2 is higher than an implantation energy in the ion implantation for forming the p-type columns PC1. Accordingly, an implantation depth in the ion implantation for forming the p-type columns PC2 is deeper than an implantation depth in the ion implantation for forming the p-type columns PC1. As a result, the p-type columns PC2 are formed at positions deeper than those of the p-type columns PC1 and accordingly under the p-type columns PC1.

In the photoresist patterns RP2a and RP2b, the openings KB1a and KB1b have different two-dimensional sizes. In plan view, the openings KB1b of the photoresist pattern RP2b internally include the openings KB1a of the photoresist pattern RP2a and the two-dimensional sizes of the openings KB1b are larger than the two-dimensional sizes of the openings KB1a. Consequently, in plan view, the p-type columns PC2 internally include the p-type columns PC1 and the two-dimensional sizes of the p-type columns PC2 are larger than the two-dimensional sizes of the p-type columns PC1. Note that, in this case also, the order in which the p-type columns PC1 and PC2 are formed can be reversed.

Thus, it is possible to form the p-type columns PC1 and PC2. No matter which one of the formation methods is used, as shown in FIGS. 14 and 17, the p-type columns PC2 internally include the p-type columns PC1 and the two-dimensional sizes of the p-type columns PC2 are larger than the two-dimensional sizes of the p-type columns PC1. The p-type columns PC1 and PC2 are apart from the trenches TR and are not adjacent to the trenches TR.

Figure 18:
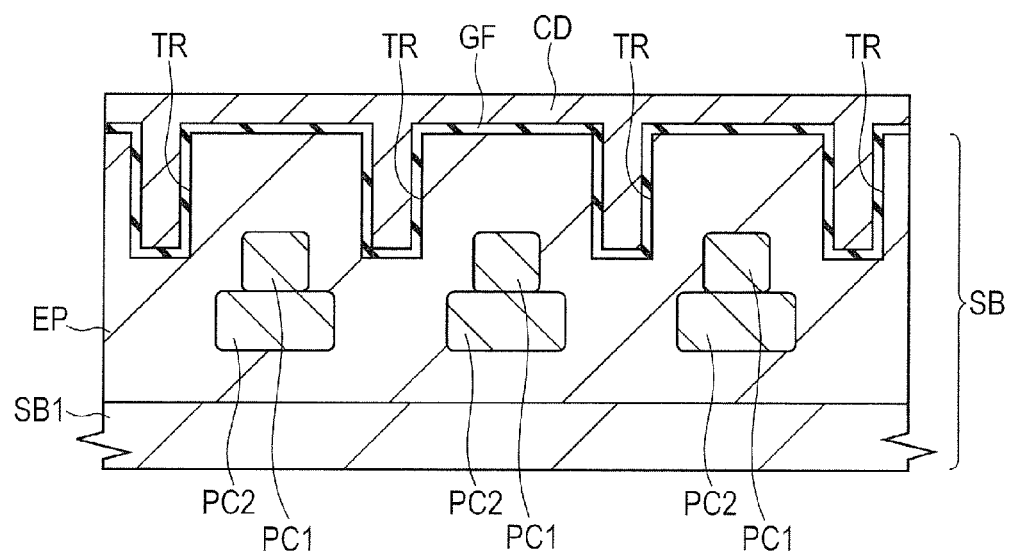
FIG. 18 is a main-portion cross-sectional view of the semiconductor device during the manufacturing process thereof, which is subsequent to FIG. 14 or 17.

Next, as shown in FIG. 18, using, e.g., a thermal oxidation method or the like, the insulating film GF made of a relatively thin silicon dioxide film or the like is formed over the inner surfaces (side and bottom surfaces) of the trenches TR. The insulating film GF is an insulating film for a gate insulating film and formed over the inner surfaces of the trenches TR and the exposed upper surface of the semiconductor layer EP.

Next, as shown in FIG. 18, over the main surface of the semiconductor substrate SB, i.e., over the insulating film GF, a conductive film CD made of a polycrystalline silicon film into which, e.g., an n-type impurity has been introduced or the like is formed so as to be embedded in the trenches TR using a CVD method or the like. The conductive film CD is a conductive film for forming the gate electrodes GE.

Figure 19:
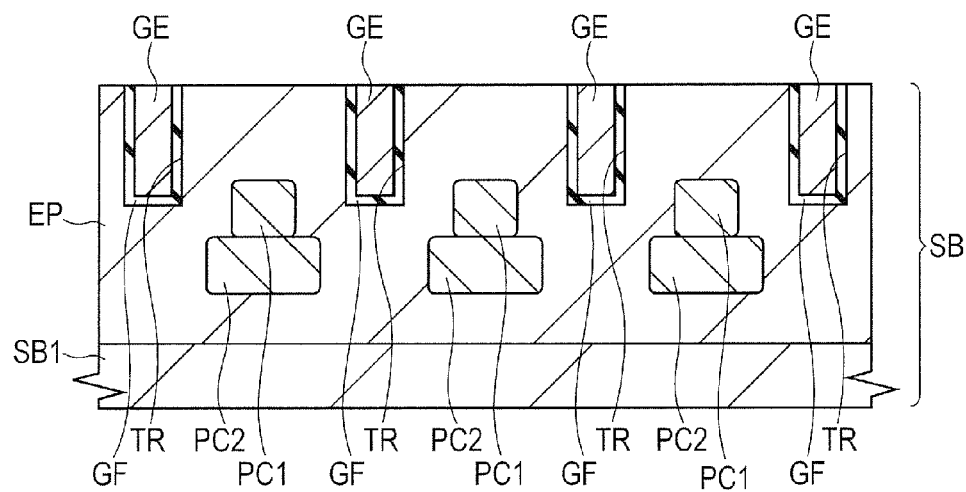
FIG. 19 is a main-portion cross-sectional view of the semiconductor device during the manufacturing process thereof, which is subsequent to FIG. 18.

Next, a photoresist pattern (not shown) which covers the regions where the foregoing gate lead-out wiring portions GE1 are to be formed and exposes the other region is formed over the conductive film CD. Then, using this photoresist pattern as an etching mask, the conductive film CD is etched back (by anisotropic etching). By the etch-back process, as shown in FIG. 19, the conductive film CD is left in the trenches TR and under the foregoing photoresist pattern, while the conductive film CD is removed from the other region. Then, the photoresist pattern is removed. The conductive film CD remaining in the trenches TR serves as the gate electrodes GE, while the conductive film CD remaining under the foregoing photoresist pattern serves as the gate lead-out wiring portions GE1. Note that the gate lead-out wiring portions GE1 are not shown in FIG. 19, but are shown in FIG. 4 described above. It is also possible to remove the insulating film GF from over the upper surface of the semiconductor layer EP in the etch-back step for the conductive film CD.

Thus, the gate electrodes GE each made of the conductive film CD embedded in the trenches TR and the gate lead-out wiring portions GE1 integrally formed with the gate electrodes GE are formed. The gate electrodes GE are in a state embedded in the trenches TR via the insulating films GF.

Figure 20:
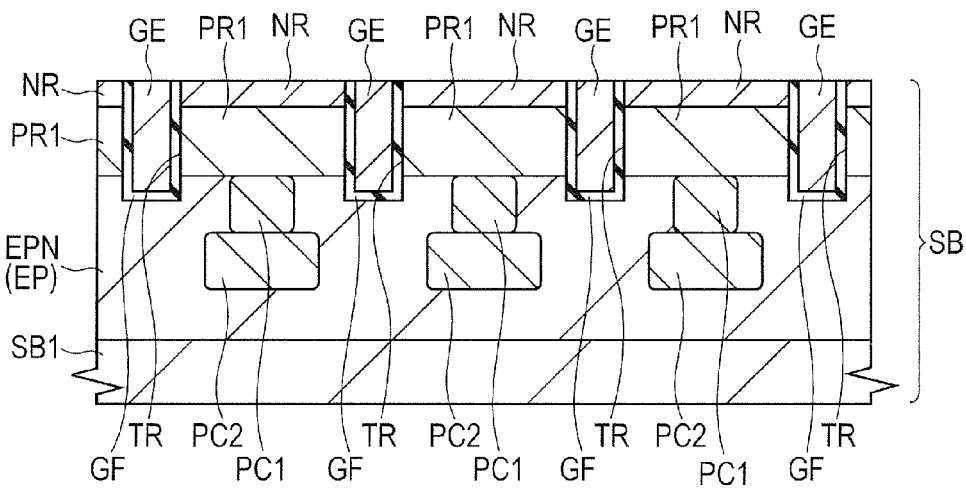
FIG. 20 is a main-portion cross-sectional view of the semiconductor device during the manufacturing process thereof, which is subsequent to FIG. 19.

Next, as shown in FIG. 20, a p-type impurity (e.g., boron (B)) is ion-implanted into the main surface (upper surface) of the semiconductor substrate SB to form the p-type semiconductor regions PR1 in the semiconductor layer EP. The p-type semiconductor regions PR1 are formed in the upper-layer portion of the semiconductor layer EP in the transistor cell formation region. The p-type semiconductor regions PR1 are formed in the regions of the semiconductor layer EP which are adjacent to the trenches TR.

Next, into the main surface (upper surface) of the semiconductor substrate SB, an n-type impurity (e.g., arsenic (As)) is ion-implanted to form the $n^+$-type semiconductor regions NR in the semiconductor layer EP. The $n^+$-type semiconductor regions NR are formed in the regions of the semiconductor layer EP which are adjacent to the trenches TR.

The depth (depth position of the bottom surface) of each of the $n^+$-type semiconductor regions NR is shallower than the depth (depth position of the bottom surface) of each of the p-type semiconductor regions PR1. Accordingly, the p-type semiconductor regions PR1 and the $n^+$-type semiconductor regions NR are formed in the upper-layer portion of the semiconductor layer EP in the transistor cell formation region. This provides a state where the $n^+$-type semiconductor regions NR are formed over the p-type semiconductor regions PR1, the p-type semiconductor regions PR1 are present under the $n^+$-type semiconductor regions NR, and the $n^+$-type semiconductor regions NR are present over the p-type semiconductor regions PR1. Since the $n^+$-type semiconductor regions NR and the p-type semiconductor regions PR1 are formed shallower than the trenches TR, a state is provided in which the trenches TR extend through the $n^+$-type semiconductor regions NR and the p-type semiconductor regions PR1 and terminate in the n-type semiconductor layer EP.

The description has been given heretofore of the case where the p-type semiconductor regions PR1 are formed first and then the $n^+$-type semiconductor regions NR are formed. However, in another form, it is also possible to form the n+-type semiconductor regions NR first and then form the p-type semiconductor regions PR1. FIG. 20 shows the stage at which both of the p-type semiconductor regions PR1 and the n+-type semiconductor regions NR have been formed.

The following is an example of the depths of the individual regions. It is possible to set the depths of the trenches TR to, e.g., about 1 µm, set the depths of the bottom surfaces of the n+-type semiconductor regions NR to, e.g., about 0.1 µm, set the depths of the bottom surfaces of the p-type semiconductor regions PR1 to, e.g., about 0.5 µm, set the depths of the bottom surfaces of the p-type columns PC1 to, e.g., about 0.6 µm from the bottom portions of the trenches TR, and set the depths of the bottom surfaces of the p-type columns PC2 to, e.g., about 1.6 µm from the bottom portions of the trenches TR. However, the depths of the individual regions are not limited thereto.

Next, activation anneal as heat treatment for activating the introduced impurities is performed. The activation anneal can be performed at, e.g., about 800 to 1000° C. This can activate the impurities introduced into the individual semiconductor regions (such as the p-type semiconductor regions PR1, the p-type columns PC1 and PC2, and the n+-type semiconductor regions NR) formed in the semiconductor substrate SB (semiconductor layer EP).

Figure 21:
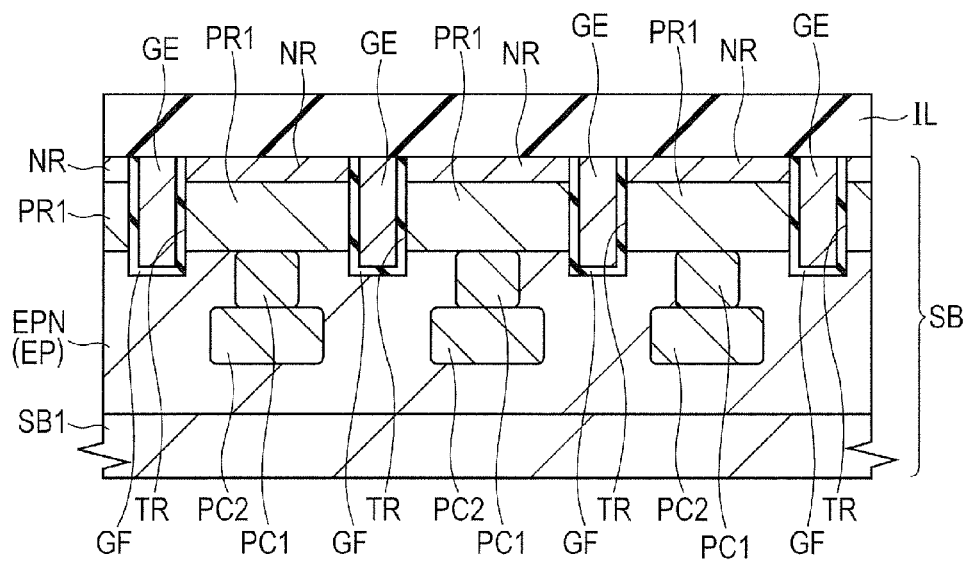
FIG. 21 is a main-portion cross-sectional view of the semiconductor device during the manufacturing process thereof, which is subsequent to FIG. 20.

Next, as shown in FIG. 21, over the main surface (upper surface) of the semiconductor substrate SB, the insulating film IL is formed as the interlayer insulating film so as to cover the gate electrodes GE and the gate lead-out wiring portions GE1. The insulating film IL is made of, e.g., a silicon dioxide film.

Figure 22:
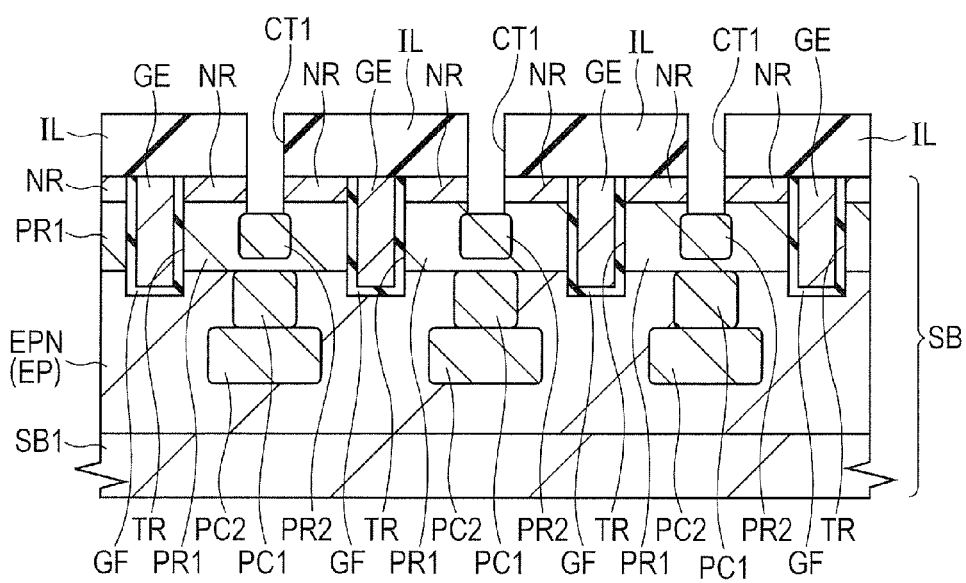
FIG. 22 is a main-portion cross-sectional view of the semiconductor device during the manufacturing process thereof, which is subsequent to FIG. 21.

Next, as shown in FIG. 22, using a photoresist pattern (not shown) formed over the insulating film IL using a photolithographic method as an etching mask, the insulating film IL is etched (by, e.g., dry etching) and the semiconductor layer EP is further etched (by, e.g., dry etching) to form the contact holes CT1. Then, the photoresist pattern is removed. The contact holes CT1 are formed between the trenches TR adjacent to each other in plan view to extend through the insulating film IL and the n+-type semiconductor regions NR so that the bottom portions of the contact holes CT1 reach the p-type semiconductor regions PR1. As a result, at the bottom surfaces of the contact holes CT1, the p-type semiconductor regions PR1 are exposed and, at the lower portions of the side surfaces of the contact holes CT1, the n+-type semiconductor regions NR are exposed.

Next, as shown in FIG. 22, a p-type impurity is ion-implanted into the p-type semiconductor regions PR1 exposed from the bottom surfaces of the contact holes CT1 to form the p+-type semiconductor regions PR2 having impurity concentrations higher than those of the p-type semiconductor regions PR1 at positions where the p+-type semiconductor regions PR2 are in contact with the bottom surfaces of the contact holes CT1.

The formation of the p+-type semiconductor regions PR2 can also be omitted. In that case, the source plugs PGS to be formed later are in direct contact with the p-type semiconductor regions PR1. However, the p+-type semiconductor regions PR2 are more preferably formed. By doing so, the contact resistances of the source plugs PGS can be reduced.

Next, using another photoresist pattern (not shown) formed over the insulating film IL using a photolithographic method as an etching mask, the insulating film IL is etched (by, e.g., dry etching) to form the contact holes CT2. The contact holes CT2 are not shown in FIG. 22, but are shown in FIG. 4 described above. The contact holes CT2 are formed over the gate lead-out wiring portions GE1 and, at the bottom portions of the contact holes CT2, the gate lead-out wiring portions GE1 are exposed. The contact holes CT2 and CT1 may also be formed in the same step.

Figure 23:
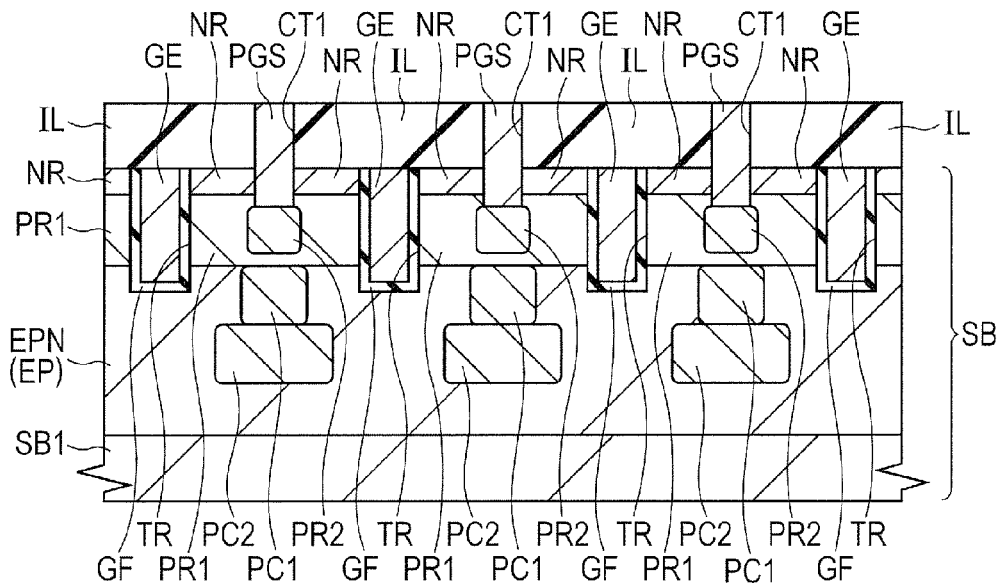
FIG. 23 is a main-portion cross-sectional view of the semiconductor device during the manufacturing process thereof, which is subsequent to FIG. 22.

Next, as shown in FIG. 23, in the contact holes CT1 and CT2, the conductive plugs PGS and PGG each made of tungsten (W) or the like are formed as the conductor portions (coupling conductor portions).

To form the plugs PGS and PGG, e.g., a barrier conductor film is formed over the insulating film IL including the inner portions (over the bottom surfaces and side walls) of the contact holes CT1 and CT2. The barrier conductor film is made of, e.g., a titanium film, a titanium nitride film, or a stacked film thereof. Then, over the barrier conductor film, a main conductor film made of a tungsten film or the like is formed so as to be embedded in the contact holes CT1 and CT2. Then, by removing the unneeded main conductor film and the unneeded barrier conductor film each located outside the contact holes CT1 and CT2 by a CMP (Chemical Mechanical Polishing) method, an etch-back method, or the like, the plugs PGS and PGG can be formed. Note that, for simpler illustration, in FIG. 23 and FIGS. 3 and 4 described above, the barrier conductor film and the main conductor film each included in the plugs PGS and PGG are integrally shown. The plugs embedded in the contact holes CT1 are the source plugs PGS and the plugs embedded in the contact holes CT2 are the gate plugs PGG.

Figure 24:
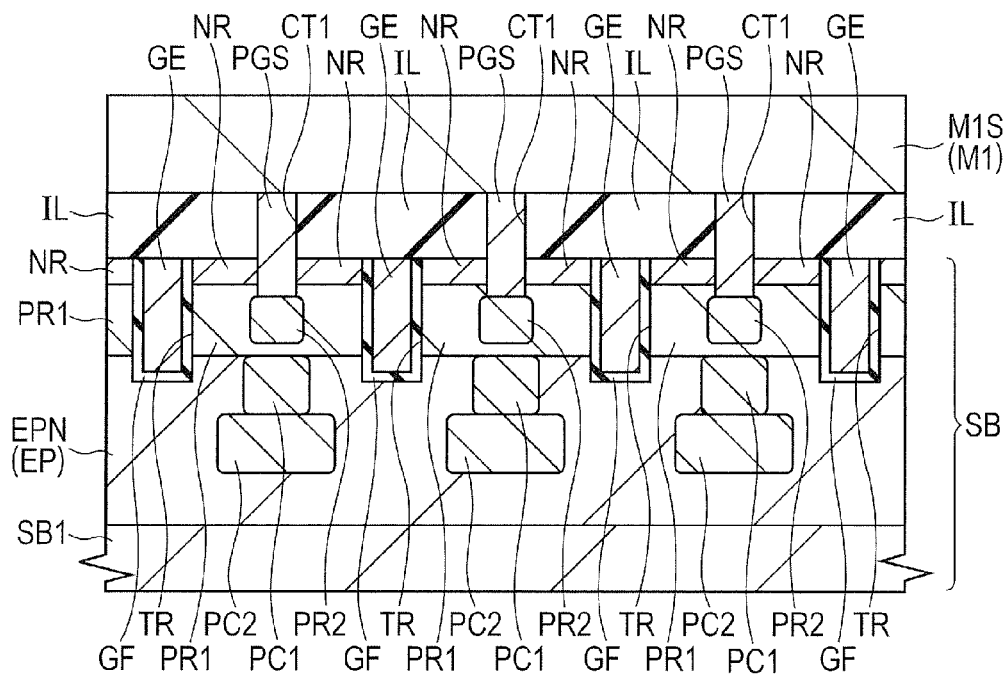
FIG. 24 is a main-portion cross-sectional view of the semiconductor device during the manufacturing process thereof, which is subsequent to FIG. 23.

Next, as shown in FIG. 24, over the main surface (upper surface) of the semiconductor substrate SB, i.e., over the insulating film IL in which the plugs PGS and PGG are embedded, a conductor film (metal film including, e.g., an aluminum film or an aluminum alloy film as a main component) is formed by a sputtering method or the like and then patterned using a photolithographic technique and an etching technique to form the wiring M1.

The source line M1S included in the wiring M1 is electrically coupled to the n+-type semiconductor regions NR and the p+-type semiconductor regions PR2 via the source plugs PGS. On the other hand, the gate line M1G included in the wiring M1 is electrically coupled to the gate lead-out wiring portions GE1 via the gate plugs PGG. The gate line M1G and the gate plugs PGG are not shown in FIG. 24, but are shown in FIG. 4 described above.

The description has been given heretofore of the case where the plugs PGS and PGG and the wiring M1 are separately formed. However, in another form, it is also possible to integrally form the plugs PGS and PGG and the wiring M1. In this case, the plugs PGS and PGG are not formed and a conductor film (metal film including, e.g., an aluminum film or an aluminum alloy film as a main component) is formed over the insulating film IL1 so as to be embedded in the contact holes CT1 and CT2 and patterned using a photolithographic technique and an etching technique to form the wiring M1. In this case, a state is achieved in which each of the plugs PGS and PGG is formed of a part of the wiring M1, i.e., the plugs PGS and PGG are integrally formed with the wiring M1.

Next, as shown in FIG. 4 described above, over the main surface of the semiconductor substrate SB, i.e., over the insulating film IL, the insulating film PA is formed so as to cover the wiring M1. The insulating film PA is made of, e.g., a polyimide-based resin or the like and formed for surface protection.

Next, using a photolithographic technique and an etching technique, the insulating film PA is patterned. Thus, the openings OP which expose parts of the wiring M1 are formed in the insulating film PA so that the bonding pads are formed. The source line MIS exposed from the source opening OPS, which is among the openings OP, serves as the source bonding pad PDS. The gate line M1G exposed from the gate opening OPG, which is among the openings OP, serves as the gate bonding pad PDG. Over the surface of the wiring M1 exposed from the openings OP (i.e., over the surfaces of the bonding pads), a metal layer (not shown) may further be formed by a plating method or the like.

Next, as necessary, the back surface of the semiconductor substrate SB is ground or polished to reduce the thickness of the semiconductor substrate SB. Then, over the entire back surface of the semiconductor substrate SB (back surface of the substrate main body SB1), a metal layer is deposited by a vapor deposition method or the like to form the back-surface electrode BE, as shown in FIGS. 3 and 4 described above. The back-surface electrode BE is electrically coupled to the drain of the trench-gate MISFET and can function as the drain electrode. The back-surface electrode BE can be formed of a stacked film in which, e.g., a titanium (Ti) layer, a nickel (Ni) layer, and a gold (Au) layer are successively stacked in order of increasing distance from the back surface of the semiconductor substrate SB.

Thus, the semiconductor device in the present embodiment is manufactured. Then, by dividing (splitting or cutting) the semiconductor substrate SB by dicing or the like, individual semiconductor chips (semiconductor devices CP) are obtained from the semiconductor substrate SB.

<About Avalanche Operation>

Figure 25:
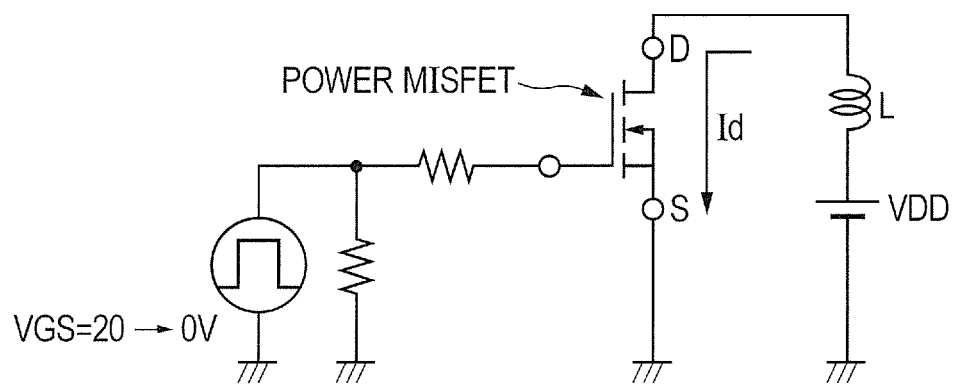
FIG. 25 is a circuit diagram showing an L-load measurement circuit.
Figure 26:
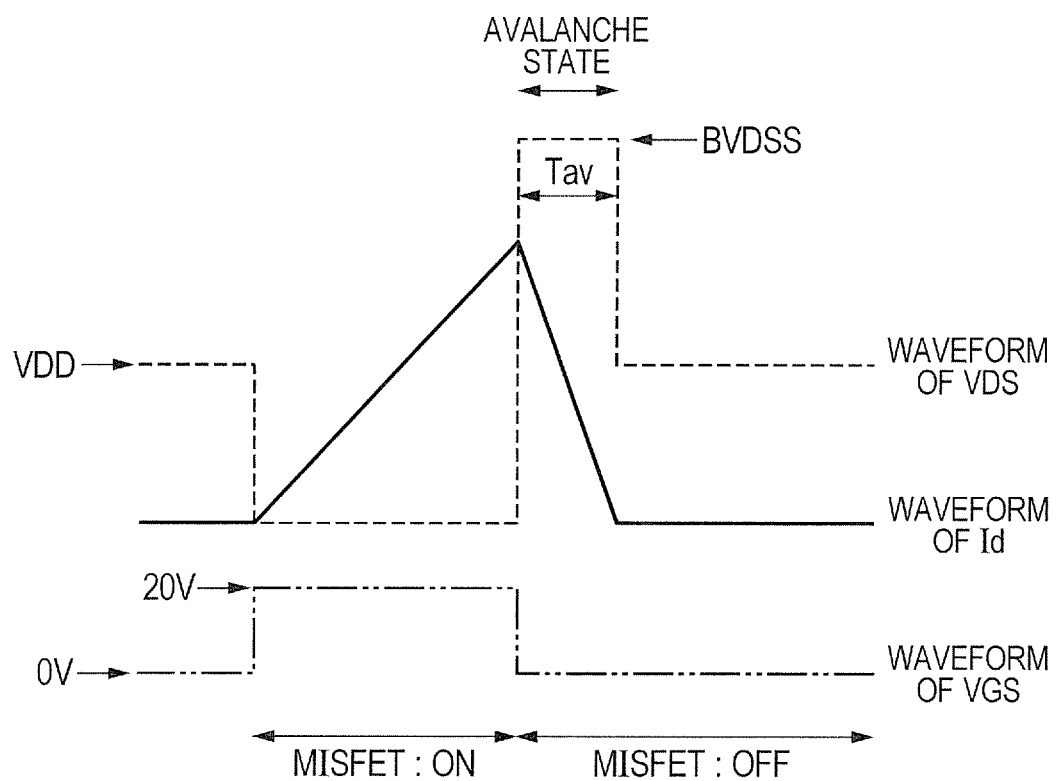
FIG. 26 is an illustrative view for illustrating an avalanche operation.

FIG. 25 is a circuit diagram showing an L-load measurement circuit. FIG. 26 is an illustrative view for illustrating an avalanche operation.

The L-load circuit shown in FIG. 25 is a circuit for determining or examining to what degree a MISFET (power MISFET) is resistant to a load (L). As main operations of the L-load circuit shown in FIG. 25, there are two types of operations when the MISFET is turned ON (when the MISFET is operated) and during the avalanche operation. FIG. 26 shows voltages and current waveforms when the MISFET is turned ON and during the avalanche operation. Note that, in FIG. 26, the waveform of a drain-source voltage (VDS) of the MISFET is shown by the dotted line, the waveform of a drain-source current (Id) of the MISFET is shown by the solid line, and a gate voltage (VGS) of the MISFET is shown by the two-dot-dash line.

In the L-load circuit shown in FIG. 25, when the MISFET is turned ON, the predetermined gate voltage (VGS), e.g., 20 V is applied to the gate of the MISFET to turn ON the MISFET. As a result, the drain-source voltage (VDS) of the power MISFET falls toward the ON voltage, while the current (Id) begins to flow between the drain and the source. The current (Id) linearly increases with the lapse of time to store energy in the L-load. Note that, in FIG. 25, the drain of the MISFET is denoted by the reference mark D and the source of the MISFET is denoted by the reference mark S.

After a predetermined time period has elapsed from the turning ON of the MISFET, the gate voltage (VGS) is set to 0 V to turn OFF (switch OFF) the MISFET. As a result, the energy stored in the L-load is released and the drain-source voltage (VDS) rapidly rises. The voltage (VDS) rises to an actual breakdown voltage value (BVDSS) of the MISFET and is stabilized. The stored energy is absorbed as avalanche energy by the MISFET.

The state where the drain-source voltage (VDS) is held at the actual breakdown voltage value (BVDSS) of the MISFET is sustained until there is no energy stored in the L-load. Then the drain-source voltage (VDS) decreases to a power supply voltage (VDD) level.

The current (Id) flowing between the drain and the source linearly decreases from a value immediately before the switching OFF as a peak value toward 0 over a predetermined time period (Tav).

When the MISFET is turned ON, the state is achieved in which the channel region (inversion layer) of the MISFET is formed and conduction is provided between the source and the drain of the MISFET through the channel region. Accordingly, the current (Id) flows through the MISFET (corresponding to the current paths DP1). During the avalanche operation, the state is achieved in which an embedded PN diode described later has broken down. Accordingly, the current (Id) flows through the embedded PN diode (corresponding to the current path DP2).

Each of the trench-gate MISFET cells has a parasitic NPN transistor described later. During the avalanche operation, when there is a significant voltage drop in the p-type region of the parasitic NPN transistor (accordingly, when the resistance of the p-type region of the parasitic NPN transistor is high), the parasitic NPN transistor may be turned ON to allow a large current to flow and possibly degrade or break down the MISFET cell.

About Studied Examples

Next, a description will be given of semiconductor devices in studied examples studied by the present inventors.

Figure 27:
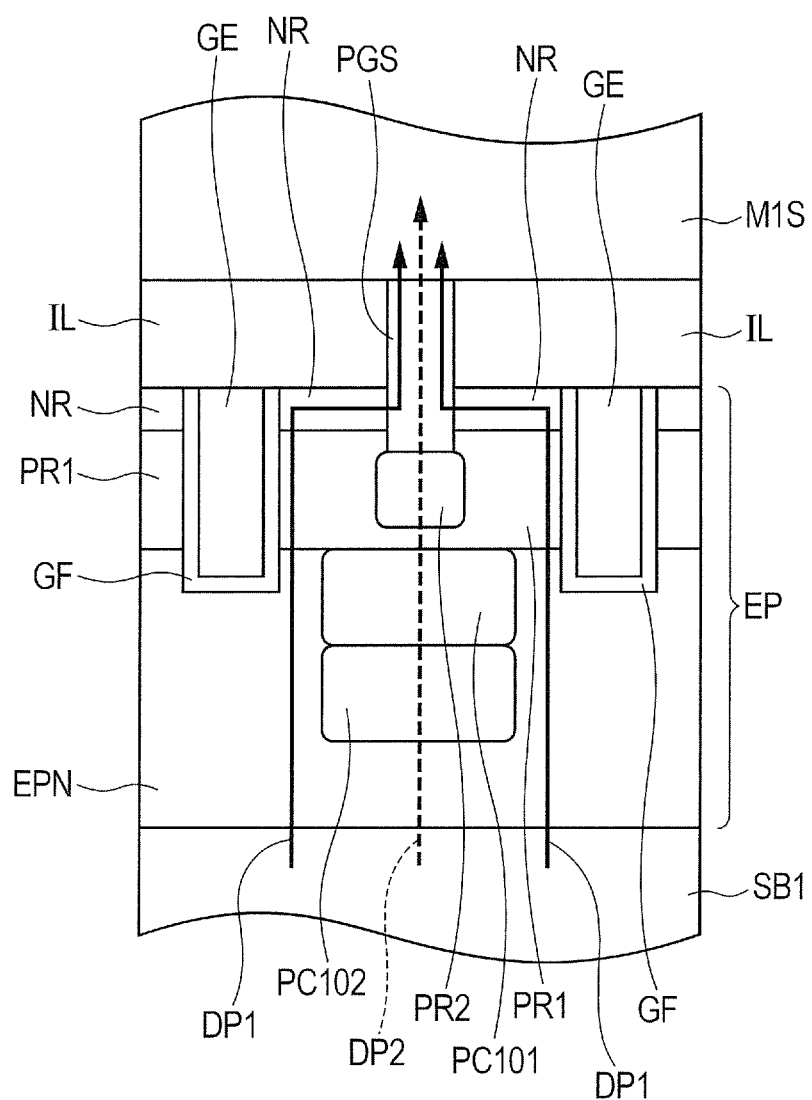
FIG. 27 is a partially enlarged cross-sectional view of a semiconductor device in a first studied example.
Figure 28:
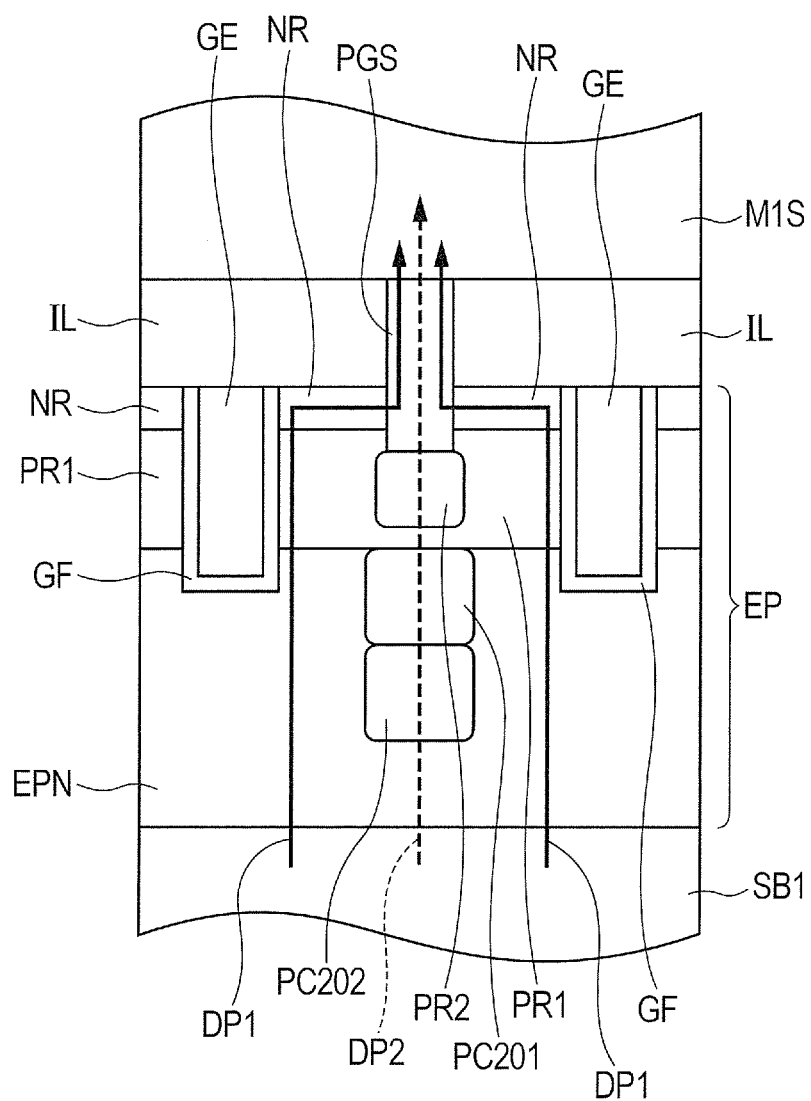
FIG. 28 is a partially enlarged cross-sectional view of a semiconductor device in a second studied example.

FIG. 27 is a main-portion cross-sectional view of the semiconductor device in the first studied example studied by the present inventors. FIG. 28 is a main-portion cross-sectional view of the semiconductor device in the second studied example studied by the present inventors. Each of FIGS. 27 and 28 corresponds to FIG. 5 described above. FIGS. 27 and 28 are cross-sectional views but, for improved clarity of illustration, hatching is omitted. In the same manner as in FIG. 5 described above, in FIGS. 27 and 28 also, the current paths DP1 when the trench-gate MISFET is operated are shown by the solid-line arrows and the current path DP2 during the avalanche operation is shown by the dotted-line arrow.

A description will be given first of the first studied example shown in FIG. 27. The semiconductor device in the first studied example shown in FIG. 27 is mainly different from the semiconductor device in the present embodiment in FIG. 5 described above in that, instead of the p-type columns PC1 and PC2, p-type columns PC101 and PC102 are formed.

The P-type column PC101 is equivalent to the p-type column PC1 in the present embodiment. The p-type column PC102 is equivalent to the p-type column PC2 in the present embodiment. The p-type column PC101 is formed under the p-type semiconductor region PR1. The p-type column PC102 is formed under the p-type column PC101. Unlike the p-type columns PC1 and PC2 in the present embodiment, the p-type column PC101 and the p-type column PC102 formed thereunder in the first studied example have the same two-dimensional shape and the same two-dimensional size and match each other in plan view.

In addition, the p-type column PC102 in the first studied example has the same two-dimensional shape and the two-dimensional size as the two-dimensional shape and the two-dimensional size of the p-type column PC2 in the present embodiment. Consequently, the two-dimensional shape and the two-dimensional size of the p-type column PC101 in the first studied example are inevitably larger than the two-dimensional shape and the two-dimensional size of the p-type column PC1 in the present embodiment.

When the trench-gate MISFET is operated (turned ON), a gate voltage of not less than the threshold voltage is applied to the gate electrode GE via the gate line M1G or the like in a state where a potential higher than that at the source bonding pad PDS (source line MIS) is applied to the back-surface electrode GE. Thus, a channel region (n-type inversion layer) is formed in the portion of the p-type semiconductor region PR1 which faces the gate electrode GE via the insulating film GF. Via the channel region (n-type inversion layer), and accordingly along the side surfaces of the trenches TR, currents are allowed to flow between the source region ($n^+$-type semiconductor region NR) and the drain region (n-type semiconductor region EPN). As a result, between the back-surface electrode BE and the source plug PGS, currents flow via the substrate main body SB1, the n-type semiconductor region EPN, the channel region, and the $n^+$-type semiconductor region NR, i.e., along the current paths DP1.

On the other hand, during the avalanche operation, a voltage exceeding a rated value is applied between the drain and the source. As a result, the embedded PN diode breaks down so that a breakdown current (avalanche current) flows along the current path DP2. That is, between the back-surface electrode BE and the source plug PGS, a current flows through the current path DP2 and consequently through the embedded PN diode.

Note that the n-type semiconductor region forming the embedded PN diode is made of the substrate main body SB1 and the n-type semiconductor region EPN. The p-type semiconductor region forming the embedded PN diode includes the p-type column (equivalent to the p-type columns PC101 and PC102 in the case of the first studied example, equivalent to p-type columns PC201 and PC202 in the case of the second studied example described later, and equivalent to the p-type columns PC1 and PC2 in the case of the present embodiment), the p-type semiconductor region PR1, and the $p^+$-type semiconductor region PR2.

On the other hand, the n-type semiconductor region EPN (n-type collector), the p-type semiconductor region PR1 (p-type base), and the $n^+$-type semiconductor region NR (n-type emitter) form a parasitic NPN transistor. The p-type base region of the parasitic NPN transistor and the p-type semiconductor region of the embedded PN diode are common.

During the avalanche operation, when an avalanche current increases to increase the voltage drop in the p-type semiconductor region of the embedded PN diode, a voltage drop in the p-type base region of the parasitic NPN transistor increases to turn ON the parasitic NPN transistor. As a result, an excessively large current amplified by the parasitic NPN transistor may flow to degrade or break down the transistor cell. The degradation or breakdown is referred to as avalanche breakdown. To increase the resistance to the avalanche breakdown (avalanche resistance or avalanche tolerance), it is necessary to reduce the likelihood of the parasitic NPN transistor to be turned ON during the avalanche operation (when the embedded PN diode breaks down).

To reduce the likelihood of the parasitic NPN transistor to be turned ON during the avalanche operation, it is effective to reduce the resistances of the p-type columns PC101 and PC102. When a significant voltage drop due to the current flowing in the p-type semiconductor region of the embedded PN diode occurs during the avalanche operation, the potential difference between the n-type emitter and the p-type base of the parasitic NPN transistor increases to forwardly bias the emitter-base junction in the parasitic NPN transistor and turn ON the parasitic NPN transistor. When the resistances of the p-type columns PC101 and PC102 are reduced, a voltage drop due to the current flowing in the p-type semiconductor region of the embedded PN diode during the avalanche operation can be inhibited. As a result, the potential difference between the n-type emitter and the p-type base in the parasitic NPN transistor can be reduced and the parasitic NPN transistor is less likely to be turned ON.

To reduce the resistances of the p-type columns PC101 and PC102, it is effective to increase the two-dimensional sizes of the p-type columns PC101 and PC102. In the first studied example shown in FIG. 27, the two-dimensional sizes of both of the p-type columns PC101 and PC102 are increased. This can reduce the resistances of the p-type columns PC101 and PC102. Accordingly, in the first studied example shown in FIG. 27, it is possible to reduce the voltage drop due to the current flowing in the p-type semiconductor region of the embedded PN diode during the avalanche operation and reduce the likelihood of the parasitic NPN transistor to be turned ON. As a result, the avalanche breakdown is less likely to occur and the avalanche resistance can be improved.

However, in the first studied example shown in FIG. 27, the two-dimensional sizes of both of the p-type columns PC101 and PC102 are increased. This can reduce the resistances of the p-type columns PC101 and PC102 but undesirably increases the resistance (ON resistance) of the trench-gate MISFET when the trench-gate MISFET is operated. That is, in the first studied example shown in FIG. 27, the two-dimensional sizes of both of the p-type columns PC101 and PC102 are increased. This brings the p-type columns PC101 and PC102 closer to the trenches TR, narrows the current paths DP1 when the trench-gate MISFET is operated, and increases the ON resistance. Since the increased ON resistance leads to the degradation of the performance of the semiconductor device, it is desired to reduce the ON resistance and improve the performance of the semiconductor device.

Note that the ON resistance corresponds to the resistance (conduction resistance) between the source line M1S (source bonding pad PDS) in the ON state (when the trench-gate MISFET is operated) and the back-surface electrode BE.

Next, a description will be given of the second studied example shown in FIG. 28. The semiconductor device in the second studied example shown in FIG. 28 is mainly different from the semiconductor device in the present embodiment in FIG. 5 described above in that, instead of the p-type columns PC1 and PC2, the p-type columns PC201 and PC202 are formed.

The p-type column PC201 is equivalent to the p-type column PC1 in the present embodiment. The p-type column PC202 is equivalent to the p-type column PC2 in the present embodiment. The p-type column PC201 is formed under the p-type semiconductor region PR1. The p-type column PC202 is formed under the p-type column PC201.

Unlike the p-type columns PC1 and PC2 in the present embodiment, the p-type column PC201 and the p-type column PC202 formed thereunder in the second studied example have the same two-dimensional shape and the same two-dimensional size and match each other in plan view. In this point, the p-type columns PC201 and PC202 are the same as the p-type columns PC101 and PC102 in the first studied example.

In addition, the p-type column PC201 in the second studied example has the same two-dimensional shape and the same two-dimensional size as the two-dimensional shape and the two-dimensional size of the p-type column PC1 in the present embodiment. Consequently, the two-dimensional shape and the two-dimensional size of the p-type column PC202 in the second studied example are inevitably smaller than of the two-dimensional shape and the two-dimensional size of the p-type column PC2 in the present embodiment.

That is, the p-type columns PC101 and PC102 in the first studied example and the p-type columns PC201 and PC202 in the second studied example are identical in that the upper and lower p-type columns have the same two-dimensional size. However, the two-dimensional sizes of the p-type columns (PC201 and PC201) in the second studied example are smaller than the two-dimensional sizes of the p-type columns (PC101 and PC102) in the first studied example.

In the case of the semiconductor device in the second studied example shown in FIG. 28, the two-dimensional sizes of both of the p-type columns PC201 and PC202 are set smaller than those of the equivalent p-type columns in the case of the semiconductor device in the first studied example shown in FIG. 27. Consequently, the p-type columns PC201 and PC202 are more distant from the trenches TR. This allows the widths of the current paths DP1 to be easily ensured when the trench-gate MISFET is operated and can reduce the ON resistance.

However, since the two-dimensional sizes of both of the p-type columns PC201 and PC202 in the case of the semiconductor device in the second example shown in FIG. 28 are set smaller than those of the equivalent p-type columns in the case of the semiconductor device in the first studied example shown in FIG. 27, the resistance of each of the p-type columns increases to result in a significant voltage drop due to the current flowing in the p-type semiconductor region of the embedded PN diode during the avalanche operation. This increases the likelihood of the parasitic NPN transistor to be turned ON and reduces the avalanche resistance. The reduced avalanche resistance leads to the degradation of the reliability of the semiconductor device. Accordingly, it is desired to improve the avalanche resistance and improve the reliability of the semiconductor device.

That is, in each of the first studied example (FIG. 27) and the second studied example (FIG. 28) in which the upper and lower p-type columns have the same two-dimensional size, when the two-dimensional size of each of the p-type columns is increased (in the case of the first studied example in FIG. 27), the ON resistance is increased. On the other hand, when the two-dimensional size of each of the p-type columns is reduced (in the case of the second studied example in FIG. 28), the avalanche resistance is reduced. Therefore, in each of the first studied example (FIG. 27) and the second studied example (FIG. 28) in which the upper and lower p-type columns have the same two-dimensional size, it is difficult to achieve both a reduction in ON resistance and an improvement in avalanche resistance.

<Main Characteristic Features and Effects>

One of the main characteristic features of the present embodiment is that the semiconductor device includes the trench-gate MISFETs (trench-gate field effect transistors).

The semiconductor device in the present embodiment has the n-type semiconductor substrate SB, the trenches TR formed in the main surface (upper surface) of the semiconductor substrate SB, and the gate electrodes GE formed in the trenches TR via the gate insulating films (insulating films GF). The semiconductor device in the present embodiment further has the p-type semiconductor regions PR1 (first semiconductor regions) formed in the semiconductor substrate SB so as to be adjacent to the trenches TR and the $n^+$-type semiconductor regions NR (second semiconductor regions) formed over the p-type semiconductor regions PR1 in the semiconductor substrate SB so as to be adjacent to the trenches TR. The p-type semiconductor regions PR1 are for forming the channels of the trench-gate MISFETs. The $n^+$-type semiconductor regions NR are for the sources of the trench-gate MISFETs. The semiconductor device in the present embodiment further has the p-type columns PC1 (third semiconductor regions) formed under the p-type semiconductor regions PR1 in the semiconductor substrate SB, the p-type columns PC2 (fourth semiconductor regions) formed under the p-type semiconductor regions PR1 in the semiconductor substrate SB, and the drain back-surface electrode BE formed over the back surface of the semiconductor substrate SB.

Another of the main characteristic features of the present embodiment is that, under the p-type semiconductor regions PR1, the p-type columns PC1 and PC2 are formed. That is, a so-called SJ (Super Junction) structure is used. The p-type columns PC1 and PC2 have the function of extending a depletion layer in a deeper direction (toward the back surface of the semiconductor substrate SB). In the case where the p-type columns PC1 and PC2 are formed, the depletion layer extends in a deeper direction (toward the back surface of the semiconductor substrate SB) than in the case where the p-type columns PC1 and PC2 are not formed. This can reduce the density of lines of electric forces, i.e., reduce electric field concentration and improve breakdown resistance.

Unlike in the present embodiment, in the case where the p-type columns PC1 and PC2 are not formed, a method which reduces the n-type impurity concentration of the semiconductor layer EP (n-type semiconductor region EPN) is used to improve the breakdown resistance. However, in that case, the ON resistance is disadvantageously increased. In the present embodiment, the SJ structure is used and the p-type columns PC1 and PC2 are formed under the p-type semiconductor regions PR1. This can improve the breakdown resistance even when the n-type impurity concentration of the semiconductor layer EP (n-type semiconductor region EPN) is not reduced. As a result, it is possible to improve the breakdown resistance, while reducing the ON resistance.

Still another of the main characteristic features of the present embodiment is that the p-type columns PC1 are included in the p-type columns PC2 in plan view and the two-dimensional size of each of the p-type columns PC2 is larger than the two-dimensional size of each of the p-type columns PC1.

Unlike in the present embodiment, in the case where the upper and lower p-type columns have the same two-dimensional size, when the two-dimensional sizes of the p-type columns (PC101 and PC102) are increased as in the first studied example in FIG. 27 described above, the ON resistance is increased. Conversely, when the two-dimensional sizes of the p-type columns (PC101 and PC102) are reduced as in the second studied example in FIG. 28 described above, the avalanche resistance is reduced.

By contrast, in the present embodiment, the upper and lower p-type columns PC1 and PC2 have different two-dimensional sizes. Specifically, the p-type columns PC1 are included in the p-type columns PC2 in plan view and the two-dimensional size of each of the p-type columns PC2 is set larger than the two-dimensional size of each of the p-type columns PC1. This can achieve a reduction in ON resistance and an improvement in avalanche resistance. The following is a specific description thereof.

An increase in the two-dimensional size of the upper p-type column PC1 is more likely to increase the ON resistance than an increase in the two-dimensional size of the lower p-type column PC2. This is because the channel region (n-type inversion layer) is formed along the side surfaces of the trenches TR in the p-type semiconductor region PR1 and, when the current paths DP1 in the drain region (n-type semiconductor region EPN) in the vicinity of the channel region are narrowed, the ON resistance is increased. The current paths DP1 in the drain region (n-type semiconductor region EPN) in the vicinity of the channel region are defined by (interposed between) the side surfaces of the trenches TR and the upper p-type column PC1. That is, a part of the upper p-type column PC1 is present at the same height position as that of each of the trenches TR and, in the thickness direction of the semiconductor substrate SB, a part of the upper p-type column PC1 overlaps the trench TR. As a result, when the two-dimensional size of the upper p-type column PC1 is increased, the space between the p-type column PC1 and the trench TR decreases to narrow the current paths DP1 in the drain region (n-type semiconductor region EPN) in the vicinity of the channel region and thus increase the ON resistance. To reduce the ON resistance, it is important not to narrow the current paths DP1 in the drain region (n-type semiconductor region EPN) in the vicinity of the channel region. Accordingly, in the present embodiment, the two-dimensional size of the upper p-type column PC1 is reduced to ensure the widths of the current paths DP1 in the drain region (n-type semiconductor region EPN) in the vicinity of the channel region and reduce the ON resistance. Thus, it is possible to improve the performance of the semiconductor device.

On the other hand, the lower p-type column PC2 is formed further under the p-type column PC1 formed under the p-type semiconductor region PR1. As a result, the lower p-type column PC2 is at a given distance from the channel region. Even when the two-dimensional size of the lower p-type column PC2 is increased, the current paths DP1 are less affected thereby than by an increase in the two-dimensional size of the upper p-type column PC1. This can prevent the ON resistance from being affected thereby.

That is, when the two-dimensional size of the upper p-type column PC1 close to the channel region is increased, the width of the current path DP1 when the trench-gate MISFET is operated is reduced to increase the ON resistance. However, even when the two-dimensional size of the lower p-type column PC2 at a given distance from the channel region is increased, an increase in ON resistance is not significant.

As has been described with reference to the foregoing studied examples, to reduce the likelihood of the parasitic NPN transistor to be turned ON during the avalanche operation, it is effective to reduce the resistances of the p-type columns (PC1 and PC2). In the present embodiment, by increasing the two-dimensional size of the p-type column PC2 under the p-type column PC1, it is possible to reduce the resistance of the p-type column PC2. This can reduce a voltage drop due to the current flowing in the p-type semiconductor region of the embedded PN diode during the avalanche operation and thus reduce the likelihood of the parasitic NPN transistor to be turned ON. As a result, avalanche breakdown is less likely to occur and the avalanche resistance can be improved. This can improve the reliability of the semiconductor device.

On the other hand, the two-dimensional size of the p-type column PC1 over the p-type column PC2 is reduced in consideration of influence on the ON resistance, as described above.

Briefly, in the present embodiment, the upper and lower p-type columns PC1 and PC2 are provided with different two-dimensional sizes such that the two-dimensional size of the lower p-type column PC2 is larger, similarly to the two-dimensional size of the lower p-type column PC102 in the first studied example in FIG. 27 described above, and the two-dimensional size of the upper p-type column PC1 is smaller, similarly to the two-dimensional size of the upper p-type column PC201 in the second studied example in FIG. 28 described above. In the present embodiment, the two-dimensional size of the upper p-type column PC1 is reduced, similarly to the two-dimensional size of the p-type column PC201 in the second studied example in FIG. 28 described above. As a result, the ON resistance in the present embodiment can considerably be reduced compared to the ON resistance in the case of the first studied example in FIG. 27 described above to have a value rather close to the value of the ON resistance in the case of the second studied example in FIG. 28 described above. In addition, the two-dimensional size of the lower p-type column PC2 is increased, similarly to the two-dimensional size of the p-type column PC102 in the first studied example in FIG. 27 described above. As a result, the avalanche resistance in the present embodiment can considerably be improved compared to the avalanche resistance in the case of the second studied example in FIG. 28 described above.

Thus, in the present embodiment, the two-dimensional size of the upper p-type column PC1 in which an increased two-dimensional size is more likely to increase the ON resistance is reduced to achieve a reduction in ON resistance. On the other hand, the two-dimensional size of the lower p-type column PC2 in which an increased two-dimensional size is less likely to increase the ON resistance is increased to achieve an improvement in avalanche resistance. Thus, it is possible to achieve both of a reduction in ON resistance and an improvement in avalanche resistance. That is, it is possible to improve the avalanche resistance, while reducing the ON resistance. From another perspective, it is possible to reduce the ON resistance, while ensuring the avalanche resistance. This can improve the reliability of the semiconductor device and also improve the performance of the semiconductor device.

To improve the avalanche resistance, while reducing the ON resistance, i.e., to reduce the ON resistance, while ensuring the avalanche resistance from another perspective, it is important to set the two-dimensional size of the lower p-type column PC2 larger than the two-dimensional size of the upper p-type column PC1. When the two-dimensional size of the upper p-type column PC1 is larger than the two-dimensional size of the lower p-type column PC2 unlike in the present embodiment, such an effect cannot be expected. On the contrary, the ON resistance is increased while the avalanche resistance is not improved or the avalanche resistance deteriorates while the ON resistance is not reduced, resulting in a disadvantage.

In the present embodiment, the two-dimensional size of the p-type column PC2 is set larger than the two-dimensional size of the p-type column PC1. Preferably, the area of the p-type column PC2 is not less than 1.4 times the area of the p-type column PC1. This allows the effect of improving the avalanche resistance, while reducing the ON resistance, to be more reliably obtained. Likewise, in the case of first to third modifications (FIGS. 33 to 35) described later, the area of a p-type column PC3a is preferably not less than double the area of a p-type column PC1a.

<About Application to Electronic System>

A description will be given of an example of the application of the semiconductor device CP in the present embodiment to an electronic system.

Examples of an electronic system including an inductive load which induces the avalanche operation include a H-bridge circuit for controlling (driving) a motor. FIGS. 29 to 32 are illustrative views showing an example of an electronic system (electronic device) to which the semiconductor device CP in the present embodiment is applied. FIGS. 29 to 32 show the case where the semiconductor device CP in the present embodiment is applied to the H-bridge circuit for motor control. Note that, in FIGS. 29 to 32, different operation modes in the same electronic system are shown.

The electronic system (electronic device) shown in FIGS. 29 to 32 forms a H-bridge control circuit which controls (drives) a motor MOT.

Specifically, the electronic system (electronic device) shown in FIGS. 29 to 32 includes the motor MOT, power MISFETs 11, 12, 13, and 14 which control the motor MOT, and diodes 15, 16, 17, and 18.

Each of the power MISFETs 11, 12, 13, and 14 is formed of the foregoing semiconductor device CP. That is, the electronic system in FIGS. 29 to 32 includes the total of four semiconductor devices CP described above which are the semiconductor device CP for the power MISFET 11, the semiconductor device CP for the power MISFET 12, the semiconductor device CP for the power MISFET 13, and the semiconductor device CP for the power MISFET 14.

In the electronic system shown in FIGS. 29 to 32, between a power supply line VB1 to which a first potential (first power supply potential) is supplied and a terminal (coupling point) TA1 coupled to a ground potential (grounding potential), the power MISFETs 11 and 12 are coupled in series. Also, between a power supply line VB2 to which a second potential (second power supply potential) is supplied and the terminal TA1 coupled to the ground potential (grounding potential), the power MISFETs 13 and 14 are coupled in series. Also, between a terminal (coupling point) TA2 between the power MISFETS 11 and 12 coupled in series and a terminal (coupling point) TA3 between the power MISFETs 13 and 14 coupled in series, the motor MOT is coupled. That is, the motor MOT is interposed between the terminals TA2 and TA3. Also, between the power supply line VB1 and the terminal TA2, the diode 15 is coupled in parallel with the power MISFET 11 and, between the terminals TA2 and TA1, the diode 16 is coupled in parallel with the power MISFET 12. Also, between the power supply line VB2 and the terminal TA3, the diode 17 is coupled in parallel with the power MISFET 13 and, between the terminals TA3 and TA1, the diode 18 is coupled in parallel with the power MISFET 14.

That is, between the power supply line VB1 (first power supply potential) and the terminal TA2, the power MISFET 11 and the diode 15 are coupled in parallel and, between the terminal TA2 and the terminal TA1 (at the ground potential), the power MISFET 12 and the diode 16 are coupled in parallel. Also, between the power supply line VB2 (second power supply potential) and the terminal TA3, the power MISFET 13 and the diode 17 are coupled in parallel and, between the terminal TA3 and the terminal TA1 (at the ground potential), the power MISFET 14 and the diode 18 are coupled in parallel. Also, between the terminals TA2 and TA3, the motor MOT is coupled.

Next, a description will be given of the operation modes.

Figure 29:
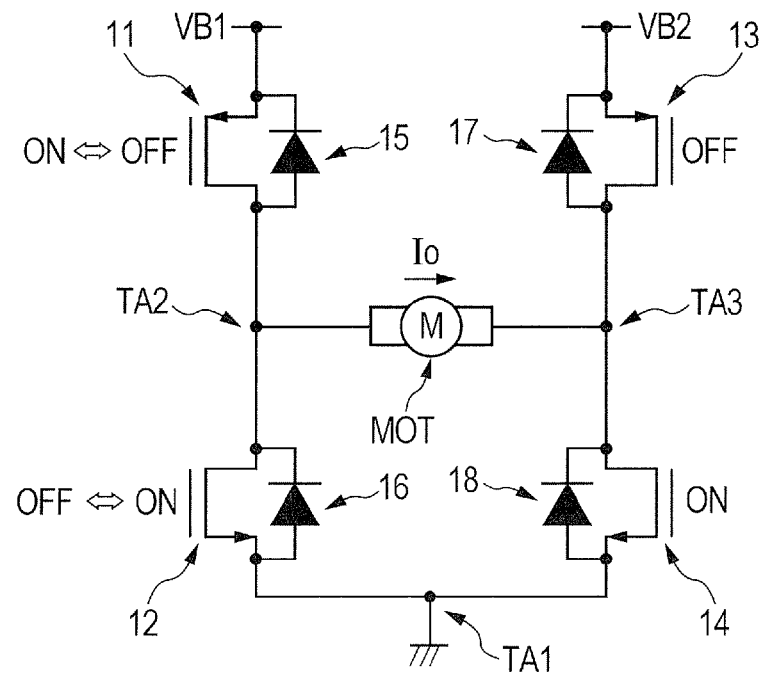
FIG. 29 is an illustrative view showing an example of an electronic system to which the semiconductor device in the embodiment is applied.

In the operation mode shown in FIG. 29, the power MISFET 14 is brought into the ON state and the power MISFET 13 is brought into the OFF state. Then, the ON/OFF state of the power MISFET 11 and the ON/OFF state of the power MISFET 12 are switched using a PWM (pulse width modulation) signal or the like. At this time, either one of the power MISFETs 11 and 12 is brought into the ON state and the other thereof is brought into the OFF state.

In the operation mode of FIG. 29, when the power MISFETs 11 and 14 are in the ON state and the power MISFETs 12 and 13 in the OFF state, a current $I_0$ flows in the motor MOT in a direction extending from the terminal TA2 toward the terminal TA3 to positively rotate the motor MOT. On the other hand, when the power MISFETs 12 and 14 are in the ON state and the power MISFETs 11 and 13 are in the OFF state, the motor MOT is braked.

Figure 30:
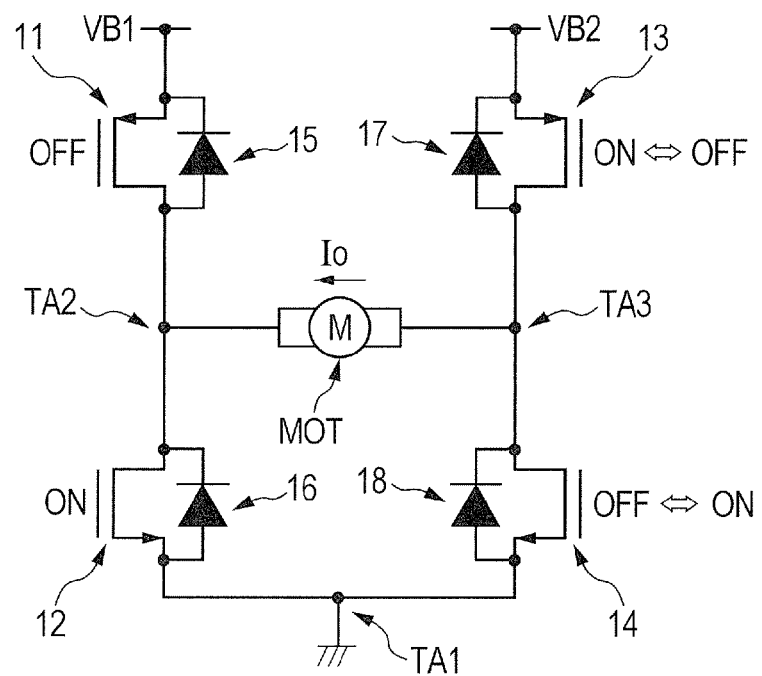
FIG. 30 is an illustrative view showing the example of the electronic system to which the semiconductor device in the embodiment is applied.

In the operation mode shown in FIG. 30, the power MISFET 12 is brought into the ON state and the power MISFET 11 is brought into the OFF state. Then, the ON/OFF state of the power MISFET 13 and the ON/OFF state of the power MISFET 14 are switched using a PWM signal or the like. At this time, either one of the power MISFETs 13 and 14 is brought into the ON state and the other thereof is brought into the OFF state.

In the operation mode in FIG. 30, when the power MISFETs 12 and 13 are in the ON state and the power MISFETs 11 and 14 are in the OFF state, the current $I_0$ flows in the motor MOT in a direction extending from the terminal TA3 toward the terminal TA2 to negatively rotate the motor MOT. Conversely, when the power MISFETs 12 and 14 are in the ON state and the power MISFETs 11 and 13 are in the OFF state, the motor MOT is braked.

Figure 31:
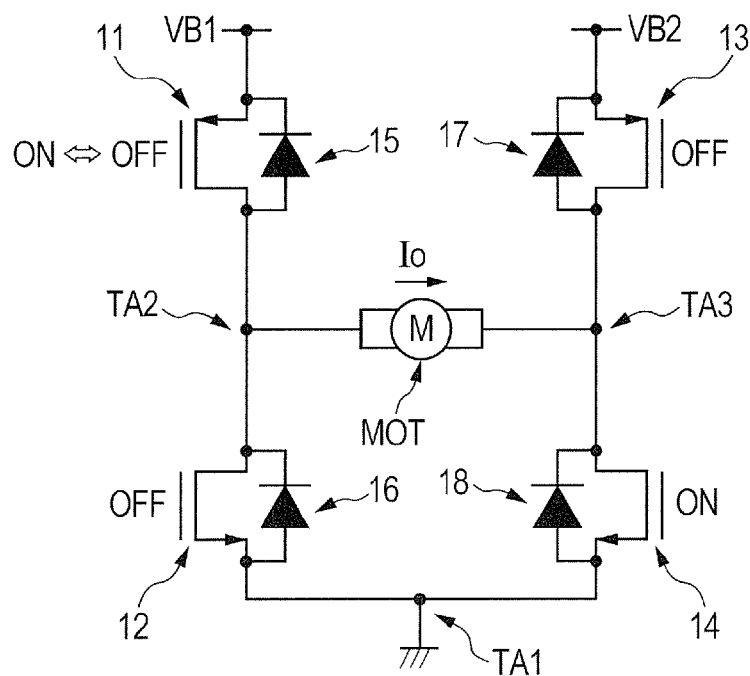
FIG. 31 is an illustrative view showing the example of the electronic system to which the semiconductor device in the embodiment is applied.

In the operation mode shown in FIG. 31, the power MISFET 14 is brought into the ON state and the power MISFETs 12 and 13 are brought into the OFF state. Then, the ON/OFF state of the power MISFET 11 is switched using a PWM signal or the like.

In the operation mode in FIG. 31, when the power MISFETs 11 and 14 are in the ON state and the power MISFETs 12 and 13 in the OFF state, the current $I_0$ flows in the motor MOT in the direction extending from the terminal TA2 toward the terminal TA3 to positively rotate the motor MOT.

Figure 32:
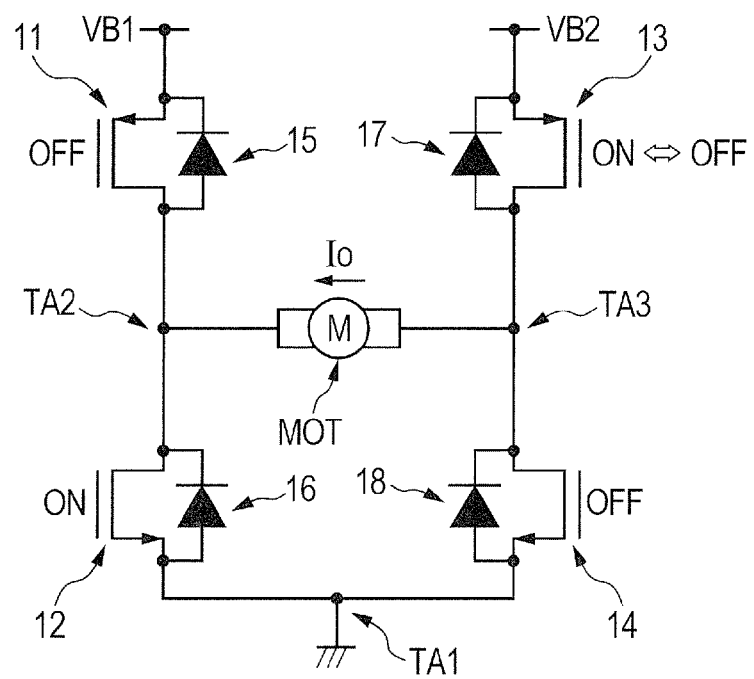
FIG. 32 is an illustrative view showing the example of the electronic system to which the semiconductor device in the embodiment is applied.

In the operation mode shown in FIG. 32, the power MISFET 12 is brought into the ON state and the power MISFETs 11 and 14 are brought into the OFF state. Then, the ON/OFF state of the power MISFET 13 is switched using a PWM signal or the like.

In the operation mode in FIG. 32, when the power MISFETs 12 and 13 are in the ON state and the power MISFETs 11 and 14 are in the OFF state, the current $I_0$ flows in the motor MOT in the direction extending from the terminal TA3 toward the terminal TA2 to negatively rotate the motor MOT.

By selectively using these operation modes (FIGS. 29 to 32) as necessary, the motor MOT can be controlled.

Thus, the semiconductor device (CP) in the present embodiment can be used appropriately as a switch for current control in, e.g., the H-bridge circuit for controlling (driving) a motor.

As described above, it is possible to improve the avalanche resistance of the semiconductor device (CP) in the present embodiment. Accordingly, it is possible to improve the reliability of the semiconductor device (CP). Therefore, it is possible to improve the reliability of the electronic system using the semiconductor device (CP) in the present embodiment.

Also, as described above, it is possible to reduce the ON resistance of the semiconductor device (CP) in the present embodiment. This can reduce the amount of energy consumption upon an ON operation and also reduce the amount of heat generation upon the ON operation. Therefore, in the electronic system using the semiconductor device (CP) in the present embodiment also, it is possible to reduce power consumption and also reduce the amount of heat generation.

About Modifications

Next, a description will be given of modifications of the semiconductor device in the present embodiment.

Figure 33:
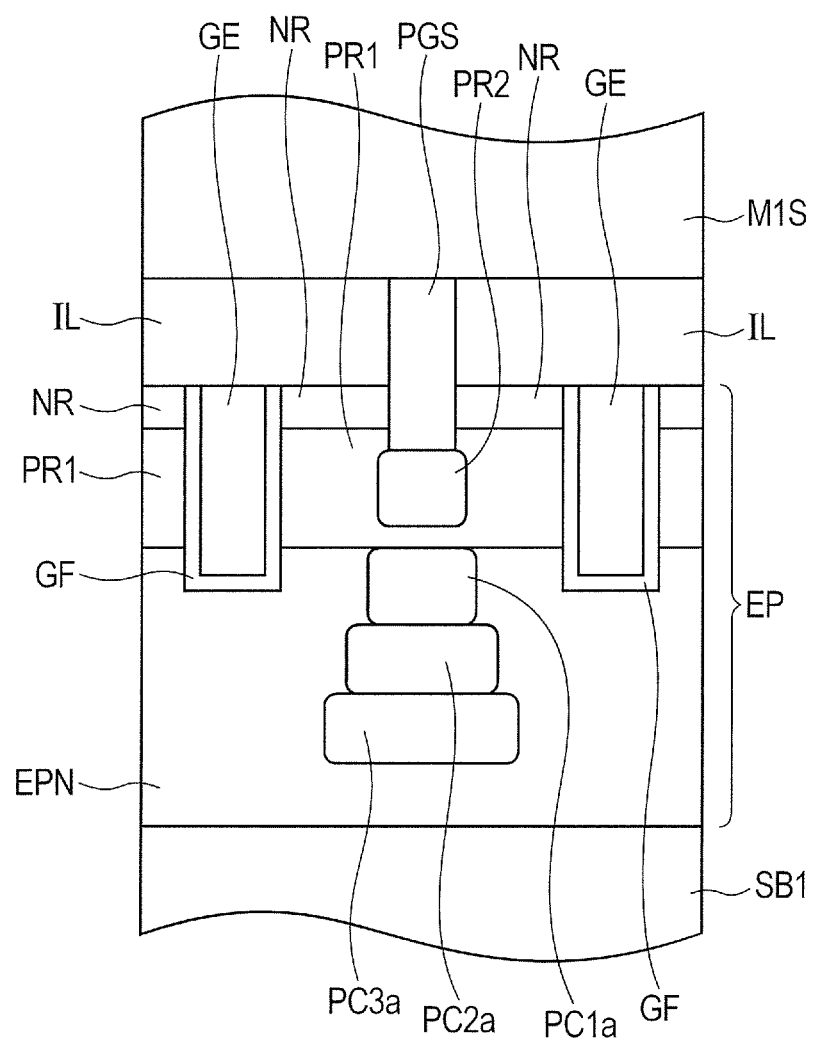
FIG. 33 is a main-portion cross-sectional view of a semiconductor device in a first modification.
Figure 34:
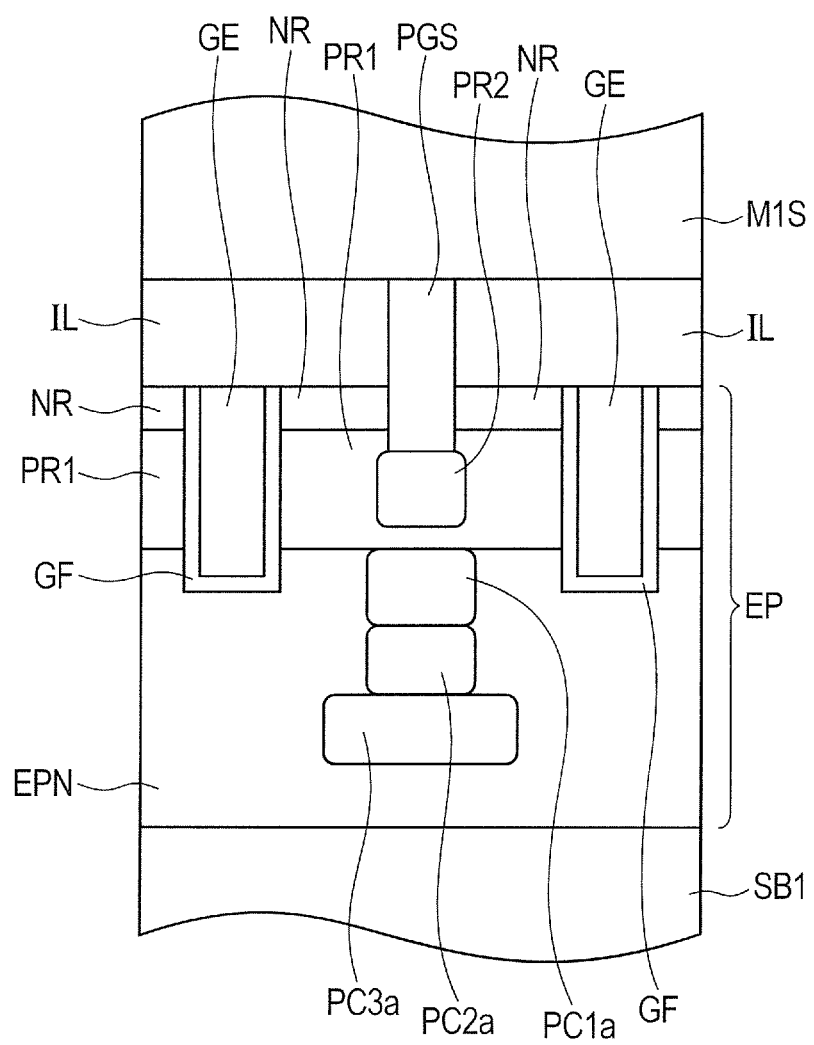
FIG. 34 is a main-portion cross-sectional view of a semiconductor device in a second modification.
Figure 35:
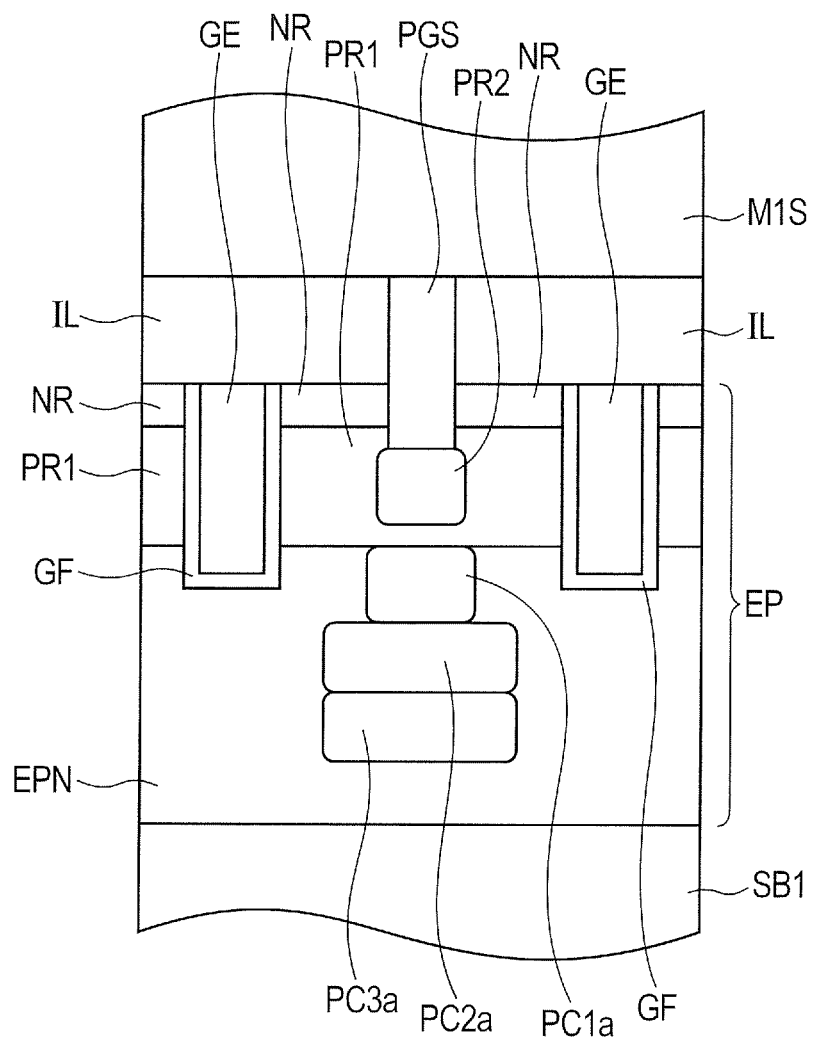
FIG. 35 is a main-portion cross-sectional view of a semiconductor device in a third modification.

FIG. 33 is a main-portion cross-sectional view of a semiconductor device in the first modification of the present embodiment. FIG. 34 is a main-portion cross-sectional view of a semiconductor device in the second modification of the present embodiment. FIG. 35 is a main-portion cross-sectional view of the semiconductor device in the third modification of the present embodiment. Each of FIGS. 33, 34, and 35 corresponds to FIG. 5 described above. Similarly to FIG. 5 described above, FIGS. 33 to 35 are cross-sectional views. However, for improved clarity of illustration, hatching is omitted therein. Note that the illustration of the current paths DP1 and DP2 shown in FIG. 5 described above is omitted in FIGS. 33 to 35.

In the same manner as in the semiconductor device in FIG. 5 described above, in each of the semiconductor devices in the first to third modifications shown in FIGS. 33 to 35 also, a stacked structure in which a plurality of p-type columns are vertically stacked is provided under the p-type semiconductor region PR1 in the semiconductor layer EP. However, the number of the stacked p-type columns in each of the semiconductor devices in the first to third modifications shown in FIGS. 33 to 35 is different from that in the semiconductor device in FIG. 5 described above.

That is, in the semiconductor device in FIG. 5 described above, the two p-type columns PC1 and PC2 are disposed to be vertically arranged under the p-type semiconductor region PR1. On the other hand, in each of the semiconductor devices in the first to third modifications shown in FIGS. 33 to 35, three p-type columns (p-type semiconductor regions) PC1a, PC2a, and PC3a are disposed to be vertically arranged under the p-type semiconductor region PR1. Specifically, in each of the semiconductor devices in the first to third modifications shown in FIGS. 33 to 35, in the semiconductor layer EP of the semiconductor substrate SB, the p-type column PC1a is formed under the p-type semiconductor region PR1, the p-type column PC2a is formed under the p-type column PC1a, and the p-type column PC3a is formed under the p-type column PC2a. Each of the p-type columns PC1a, PC2a, and PC3a is a p-type semiconductor region into which a p-type impurity has been introduced. In each of the semiconductor devices in the first to third modifications also, an SJ structure is used. Similarly to the p-type columns PC1 and PC2 in the case of FIG. 5, the p-type columns PC1a, PC2a, and PC3a in the case of FIGS. 33 to 35 are also provided so as to extend a depletion layer toward the back surface of the semiconductor substrate SB and improve the breakdown resistance.

In the semiconductor device in FIG. 5 described above, the stacked structure in which the two p-type columns PC1 and PC2 are vertically stacked is provided under the p-type semiconductor region PR1. The p-type column PC1 is internally included in the p-type column PC2 in plan view and the two-dimensional size of the p-type column PC2 is larger than the two-dimensional size of the p-type column PC1.

By contrast, in each of the semiconductor devices in the first to third modifications shown in FIGS. 33 to 35, a stacked structure in which the three p-type columns PC1a, PC2a, and PC3a are vertically stacked is provided under the p-type semiconductor region PR1. The p-type column PC1a is internally included in the p-type column PC2a in plan view, the p-type column PC2a is internally included in the p-type column PC3a in plan view, and the two-dimensional size (plane area) of the p-type column PC3a is larger than the two-dimensional size (plane area) of the p-type column PC1a.

In the case of the first modification shown in FIG. 33, the two-dimensional size (plane area) of the p-type column PC2a is larger than the two-dimensional size (plane area) of the p-type column PC1a and smaller than the two-dimensional size (plane area) of the p-type column PC3a. In the case of the second modification shown in FIG. 34, the p-type columns PC1a and PC2a match each other in plan view and the two-dimensional size (plane area) of the p-type column PC1a is equal to the two-dimensional size (plane area) of the p-type column PC2a. In the case of the third modification shown in FIG. 35, the p-type columns PC2a and PC3a match each other in plan view and the two-dimensional size (plane area) of the p-type column CP2a is equal to the two-dimensional size (plane area) of the p-type column PC3a.

Note that FIGS. 5 and 33 to 35 are common in that the stacked structure in which the plurality of p-type columns are vertically stacked and which is provided under the p-type semiconductor region PR1 is apart from the trenches TR (is not in contact with the trenches TR). FIGS. 5 and 33 to 35 are also common in that the bottom surface of the portion of the p-type semiconductor region PR1 which does not overlap the uppermost p-type column (corresponding to the p-type column PC1 or the p-type column PC3) in the stacked structure in plan view is adjacent to the portion of the semiconductor layer EP (n-type semiconductor region EPN) which retains the n-type conductivity type.

Manufacturing processes of the semiconductor devices in the first to third modifications are basically the same as the manufacturing process described with reference to FIGS. 9 to 24 described above.

In each of the steps of forming the p-type columns PC1a, PC2a, and PC3a, as has been described with reference to FIGS. 11 to 14 described above, an inclination angle for ion implantation may be changed or, as has been described with reference to FIGS. 15 to 17 described above, a mask (photoresist pattern) for ion implantation may be formed again.

For example, in the case of the first modification, it is appropriate to use a common photoresist pattern as a mask in the ion implantation for forming the p-type column PC1a, in the ion implantation for forming the p-type column PC2a, and in the ion implantation for forming the p-type column PC3a and vary the inclination angle for ion implantation. Specifically, the inclination angles for the ion implantation for forming the p-type column PC1a, the ion implantation for forming the p-type columns PC2a, and the ion implantation for forming the p-type column PC3a are set progressively larger in this order. Alternatively, in the case of the first modification, different photoresist patterns may be used as a mask in the ion implantation for forming the p-type column PC1a, the ion implantation for forming the p-type columns PC2a, and the ion implantation for forming the p-type column PC3a. In that case, the inclination angle for ion implantation need not be varied.

A technical idea common to the present embodiment and the first to third modifications is that, for that one of the plurality of vertically stacked p-type columns which is likely to increase the ON resistance when the two-dimensional size thereof is increased, the two-dimensional size thereof is reduced to reduce the ON resistance and, for that one of the plurality of vertically stacked p-type columns which is less likely to increase the ON resistance even when the two-dimensional size thereof is increased, the two-dimensional size thereof is increased to improve avalanche resistance.

Of the plurality of vertically stacked p-type columns, the p-type column closest to the channel region (i.e., the uppermost p-type column) is most likely to increase the ON resistance when the two-dimensional size thereof is increased. The p-type columns more distant from the channel region (i.e., lower p-type columns) are less likely to increase the ON resistance even when the two-dimensional sizes thereof are increased. Accordingly, among the vertically stacked p-type columns PC1a, PC2a, and PC3a, the uppermost p-type column PC1a is most likely to increase the ON resistance when the two-dimensional size thereof is increased. The p-type columns PC1a, PC2a, and PC3a are increasingly less likely to increase the ON resistance in this order even when the two-dimensional sizes thereof are increased.

In view of this, in the present embodiment and the first to third modifications, the p-type column which is among the plurality of vertically stacked p-type columns and closest to the channel region, i.e., the uppermost p-type column (corresponding to the p-type column PC1 or p-type column PC1a) has a smallest two-dimensional size. This can ensure a width for the current path in the drain region (n-type semiconductor region EPN) in the vicinity of the channel region and achieve a reduction in ON resistance.

In the present embodiment and the first to third modifications, the lowermost p-type column (corresponding to the p-type column PC2 or PC3) among the plurality of vertically stacked p-type columns is least likely to increase the ON resistance even when the two-dimensional size thereof is increased. Accordingly, by providing the lowermost p-type column with a largest two-dimensional size, the resistance of the p-type column is reduced. This can reduce a voltage drop due to the current flowing in the p-type semiconductor region of the embedded PN diode during an avalanche operation and thus reduce the likelihood of the parasitic NPN transistor to be turned ON. As a result, the avalanche breakdown is less likely to occur and the avalanche resistance can be improved.

Note that each of the semiconductor devices in the first to third modifications also has the p-type column PC2a located between the uppermost p-type column PC1a and the lowermost p-type column PC3a. It is necessary for the p-type column PC2a not to be smaller than the p-type column PC1a over the p-type column PC2a and not to be larger than the p-type column PC3a under the p-type column PC2a.

This is because, when a comparison is made between the p-type columns PC1a and PC2a, the p-type column PC1a is more likely to increase the ON resistance when the two-dimensional size thereof is increased and, accordingly, setting the two-dimensional size of the p-type column PC1a larger than the two-dimensional size of the p-type column PC2a is inconsistent with the perspective of minimizing the ON resistance, while suppressing the degradation of the avalanche resistance. This is also because, when a comparison is made between the p-type columns PC2a and PC3a, the p-type column PC3a is less likely to increase the ON resistance even when the two-dimensional size thereof is increased and, accordingly, setting the two-dimensional size of the p-type column PC3a smaller than the two-dimensional size of the p-type column PC2a is inconsistent with the perspective of minimizing the resistance of the entire p-type column, while suppressing an increase in ON resistance, and improving the avalanche resistance.

Therefore, the two-dimensional size of the p-type column PC2a needs to be set larger than the two-dimensional size of the p-type column C1a and smaller than the two-dimensional size of the p-type column PC3a as in the case of the first modification. Alternatively, the two-dimensional size of the p-type column PC2a needs to be set equal to the two-dimensional size of the p-type column PC1a as in the case of the second modification or equal to the two-dimensional size of the p-type column PC3a as in the case of the third modification. Thus, in the cases of the first to third modifications also, it is possible to reduce the ON resistance and improve the avalanche resistance.

When the first to third modifications are compared to each other, the second modification is advantageous in terms of minimizing the ON resistance and the third modification is advantageous in terms of minimizing the resistance of the entire p-type column and maximizing the avalanche resistance. On the other hand, the first modification is advantageous in terms of achieving a reduction in ON resistance and an improvement in avalanche resistance in a well-balanced manner and can improve the general reliability and performance of the semiconductor device.

The first to third modifications can also be applied to the case where the four or more p-type columns are vertically stacked under the p-type semiconductor region PR1.

Accordingly, in the case where the two p-type columns are stacked under the p-type semiconductor region PR1 (the case in FIG. 5 described above), the relationship between the two p-type columns (PC1 and PC2) can be described as follows.

That is, the upper p-type column (PC1) is internally included in the lower p-type column (PC2) in plan view and the two-dimensional size of the lower p-type column (PC2) is larger than the two-dimensional size (plane area) of the upper p-type column (PC1).

On the other hand, in the case where the three or more p-type columns are vertically stacked under the p-type semiconductor region PR1 (the case in FIGS. 33 to 35 described above), the relationship among the three or more p-type columns (PC1a, PC2a, and PC3a) can be described as follows.

That is, the relationship between any two of the three or more p-type columns (third semiconductor regions) vertically stacked under the p-type semiconductor region PR1 which are vertically adjacent to each other is such that the upper p-type column is internally included in the lower p-type column in plan view. The lowermost one of the three or more p-type columns vertically stacked under the p-type semiconductor region PR1 has a two-dimensional size (plane area) larger than the two-dimensional size (plane area) of the uppermost one of the three or more p-type columns vertically stacked under the p-type semiconductor region PR1.

This prevents the lower one of the plurality of p-type columns vertically stacked under the p-type semiconductor region PR1 from having a two-dimensional size larger than that of the upper one of the plurality of p-type columns vertically stacked under the p-type semiconductor region PR1. In addition, the two-dimensional size of the lowermost p-type column is larger than the two-dimensional size of the uppermost p-type column. Thus, it is possible to efficiently ensure the current paths when the trench-gate MISFET is operated and thus reduce the ON resistance and also reduce the overall resistance of the plurality of stacked p-type columns and thus improve the avalanche resistance.

The wording "A is internally included in B in plan view" means that A is included in B in plan view. Accordingly, when the wording "A is internally included in B in plan view" is used, entire A overlaps entire B or a part of B in plan view and A does not protrude from B. Not only the case where entire A overlaps a part of B in plan view and the two-dimensional size (plane area) of A is smaller than the two-dimensional size (plane area) of B, but also the case where A and B completely match each other in plan view and the two-dimensional shape and the two-dimensional size (plane area) of A are equal to the two-dimensional shape and the two-dimensional size (plane area) of B is included in the case where "A is internally included in B in plan view". However, in the case where "A is internally included in B in plan view and the two-dimensional size of A is smaller than the two-dimensional size of B", the two-dimensional size of A is smaller than the two-dimensional size of B. Accordingly, the case where A and B completely match each other in plan view is excluded therefrom.

While the invention achieved by the present inventors has been specifically described heretofore on the basis of the embodiment thereof, the present invention is not limited to the foregoing embodiment. It will be appreciated that various changes and modifications can be made in the invention within the scope not departing from the gist thereof.

What is claimed is:

1. A semiconductor device having a trench-gate field effect transistor, comprising:
    a semiconductor substrate having a first conductivity type;
    a trench formed in a main surface of the semiconductor substrate;
    a gate electrode for the trench-gate field effect transistor formed in the trench via a gate insulating film;
    a first semiconductor region having a second conductivity type opposite to the first conductivity type and formed in the semiconductor substrate so as to be adjacent to the trench, the first semiconductor region being for forming a channel of the trench-gate field effect transistor;
    a second semiconductor region having the first conductivity type and formed over the first semiconductor region in the semiconductor substrate so as to be adjacent to the trench, the second semiconductor region being for a source of the trench-gate field effect transistor;
    a third semiconductor region having the second conductivity type and formed under the first semiconductor region in the semiconductor substrate;
    a fourth semiconductor region having the second conductivity type and formed under the third semiconductor region in the semiconductor substrate; and
    a back-surface electrode formed over a back surface of the semiconductor substrate which is opposite to the main surface thereof, the back-surface electrode being for a drain of the trench-gate field effect transistor,
    wherein the third semiconductor region is internally included in the fourth semiconductor region in plan view, and
    wherein a two-dimensional size of the fourth semiconductor region is larger than a two-dimensional size of the third semiconductor region.

2. The semiconductor device according to claim 1, wherein the third and fourth semiconductor regions are apart from the trench.

3. The semiconductor device according to claim 1, wherein the semiconductor substrate includes a substrate main body having the first conductivity type and a semiconductor layer having the first conductivity type and an impurity concentration lower than that of the substrate main body and formed over the substrate main body, and
    wherein the trench and the first, second, third, and fourth semiconductor regions are formed in the semiconductor layer.

4. The semiconductor device according to claim 3, wherein a bottom surface of a portion of the first semiconductor region which does not overlap the third semiconductor region in plan view, a side surface of the third semiconductor region, and a side surface of the fourth semiconductor region are adjacent to a portion of the semiconductor layer which retains the first conductivity type.

5. The semiconductor device according to claim 1, further comprising:
    an interlayer insulating film formed over the main surface of the semiconductor substrate;
    a contact hole extending through the interlayer insulating film;
    a conductor portion embedded in the contact hole; and
    wiring formed over the interlayer insulating film,
    wherein the wiring includes a source line, and
    wherein the source line is electrically coupled to the first and second semiconductor regions via the conductor portion.

6. The semiconductor device according to claim 5,
    wherein the contact hole extends through the interlayer insulating film and the second semiconductor region,
    wherein a fifth semiconductor region having the second conductivity type and an impurity concentration higher than that of the first semiconductor region is formed at a position in the first semiconductor region which is adjacent to a bottom surface of the contact hole, and
    wherein the conductor portion embedded in the contact hole is electrically coupled to the second semiconductor region and electrically coupled to the first semiconductor region via the fifth semiconductor region.

7. A semiconductor device having a trench-gate field effect transistor, comprising:
    a semiconductor substrate having a first conductivity type;
    a trench formed in a main surface of the semiconductor substrate;
    a gate electrode for the trench-gate field effect transistor formed in the trench via a gate insulating film;
    a first semiconductor region having a second conductivity type opposite to the first conductivity type and formed in the semiconductor device so as to be adjacent to the trench, the first semiconductor region being for forming a channel of the trench-gate field effect transistor;
    a second semiconductor region having the first conductivity type and formed over the first semiconductor region in the semiconductor substrate so as to be adjacent to the trench, the second semiconductor region being for a source of the trench-gate field effect transistor;
    a stacked structure formed under the first semiconductor region in the semiconductor substrate; and
    a back-surface electrode formed over a back surface of the semiconductor substrate which is opposite to the main surface thereof, the back-surface electrode being for a drain of the trench-gate field effect transistor, wherein the stacked structure includes three or more vertically stacked third semiconductor regions each having the second conductivity type, wherein, of the three or more third semiconductor regions included in the stacked structure, any two vertically adjacent to each other have a relationship therebetween such that the upper third semiconductor region is internally included in the lower third semiconductor region in plan view, and wherein, of the three or more third semiconductor regions included in the stacked structure, the third semiconductor region at a lowermost position has a two-dimensional size larger than a two-dimensional size of the third semiconductor region at an uppermost position.

8. The semiconductor device according to claim 7,
wherein the stacked structure is apart from the trench.

9. The semiconductor device according to claim 7,
wherein the semiconductor substrate includes a substrate main body having the first conductivity type and a semiconductor layer having the first conductivity type and an impurity concentration lower than that of the substrate main body and formed over the substrate main body, and wherein the trench, the first and second semiconductor regions, and the stacked structure are formed in the semiconductor layer.

\* \* \* \* \*